(12) United States Patent
Kariya

(10) Patent No.: US 11,894,063 B2
(45) Date of Patent: Feb. 6, 2024

(54) SEMICONDUCTOR MEMORY DEVICE

(71) Applicant: Kioxia Corporation, Tokyo (JP)

(72) Inventor: Nayuta Kariya, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 135 days.

(21) Appl. No.: 17/695,060

(22) Filed: Mar. 15, 2022

(65) Prior Publication Data

US 2023/0069251 A1  Mar. 2, 2023

(30) Foreign Application Priority Data

Aug. 25, 2021 (JP) .................... 2021-137150

(51) Int. Cl.

| | |
|---|---|
| G11C 16/14 | (2006.01) |
| G11C 16/04 | (2006.01) |
| G11C 5/06 | (2006.01) |
| G11C 16/26 | (2006.01) |
| H10B 41/10 | (2023.01) |
| H10B 41/27 | (2023.01) |
| H10B 41/40 | (2023.01) |

(Continued)

(52) U.S. Cl.
CPC ............ G11C 16/14 (2013.01); G11C 5/06 (2013.01); G11C 16/0483 (2013.01); G11C 16/26 (2013.01); H10B 41/10 (2023.02); H10B 41/27 (2023.02); H10B 41/40 (2023.02); H10B 43/10 (2023.02); H10B 43/27 (2023.02); H10B 43/40 (2023.02)

(58) Field of Classification Search
CPC ....... G11C 16/14; G11C 5/06; G11C 16/0483; G11C 16/26; G11C 16/10; G11C 16/16; H10B 41/10; H10B 41/27; H10B 41/40; H10B 43/10; H10B 43/27; H10B 43/40; H10B 43/35
See application file for complete search history.

(56) References Cited

U.S. PATENT DOCUMENTS

| | | | |
|---|---|---|---|
| 8,338,875 B2 | 12/2012 | Nakao | |
| 11,521,691 B1 * | 12/2022 | Hsu ........................ | G11C 16/24 |

(Continued)

FOREIGN PATENT DOCUMENTS

JP     2009-283488 A     12/2009

*Primary Examiner* — Xiaochun L Chen
(74) *Attorney, Agent, or Firm* — Oblon, McClelland, Maier & Neustadt, L.L.P.

(57) ABSTRACT

A semiconductor memory device includes first conductive layers arranged in a first direction, a second conductive layer disposed at a position overlapping with the first conductive layers viewed from the first direction, a third conductive layer disposed at a position overlapping with the first conductive layers viewed from the first direction and arranged with the second conductive layer in a second direction intersecting with the first direction, a first semiconductor column opposed to the first conductive layers and the second conductive layer, a second semiconductor column opposed to the first conductive layers and the third conductive layer, and a fourth conductive layer disposed between the second conductive layer and the third conductive layer. The fourth conductive layer has a length in the second direction smaller than a length of the second conductive layer in the second direction and a length of the third conductive layer in the second direction.

20 Claims, 29 Drawing Sheets

(51) Int. Cl.
  *H10B 43/10* (2023.01)
  *H10B 43/27* (2023.01)
  *H10B 43/40* (2023.01)

(56) References Cited

U.S. PATENT DOCUMENTS

2017/0243817 A1  8/2017 Yamashita
2020/0303397 A1  9/2020 Cui et al.
2022/0406378 A1* 12/2022 Yang ..................... G11C 16/10

\* cited by examiner

SEMICONDUCTOR MEMORY DEVICE

CROSS-REFERENCE TO RELATED APPLICATIONS

This application is based upon and claims the benefit of Japanese Patent Application No. 2021-137150, filed on Aug. 25, 2021, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conductive layers arranged in a direction intersecting with a surface of this substrate, a semiconductor column opposed to these plurality of conductive layers, a gate insulating layer disposed between the conductive layers and the semiconductor column. The gate insulating layer includes a memory portion configured to store data. The memory portion is, for example, an insulating electric charge accumulating layer of silicon nitride (SiN) or the like or a conductive electric charge accumulating layer, such as a floating gate, or the like.

DETAILED DESCRIPTION

Figure 1:
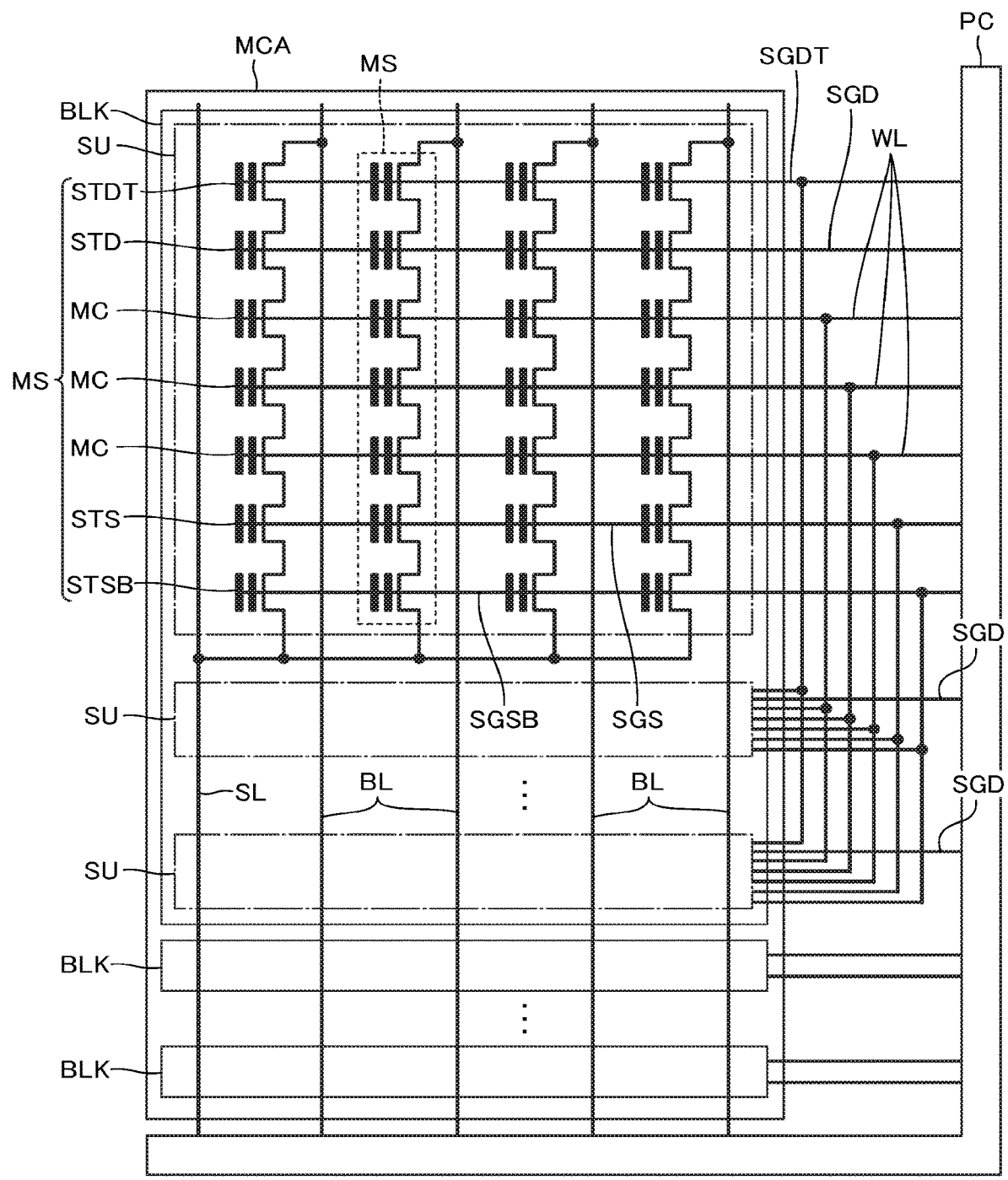
FIG. 1 is a schematic circuit diagram illustrating a configuration of a semiconductor memory device according to a first embodiment.

A semiconductor memory device according to one embodiment comprises a substrate, a plurality of first conductive layers, a second conductive layer, a third conductive layer, a plurality of first semiconductor column rows, a plurality of first electric charge accumulating layers, a plurality of second semiconductor column rows, a plurality of second electric charge accumulating layers, a fourth conductive layer, a first insulating layer, and a second insulating layer. The plurality of first conductive layers are arranged in a first direction intersecting with a surface of the substrate. The second conductive layer is disposed at a position overlapping with the plurality of first conductive layers viewed from the first direction. The third conductive layer is disposed at a position overlapping with the plurality of first conductive layers viewed from the first direction. The third conductive layer is arranged with the second conductive layer in a second direction intersecting with the first direction. The plurality of first semiconductor column rows are arranged in the second direction. The plurality of first electric charge accumulating layers are disposed between each of a plurality of first semiconductor columns included in the plurality of first semiconductor column rows and the plurality of first conductive layers. The plurality of second semiconductor column rows are arranged in the second direction. The plurality of second electric charge accumulating layers are disposed between each of a plurality of second semiconductor columns included in the plurality of second semiconductor column rows and the plurality of first conductive layers. The fourth conductive layer is disposed between the second conductive layer and the third conductive layer. The fourth conductive layer extends in a third direction intersecting with the first direction and the second direction. The first insulating layer is disposed between the second conductive layer and the fourth conductive layer. The second insulating layer is disposed between the third conductive layer and the fourth conductive layer. The plurality of first semiconductor column rows each include the plurality of first semiconductor columns arranged in the third direction. The plurality of first semiconductor columns are each opposed to the plurality of first conductive layers and the second conductive layer. The plurality of second semiconductor column rows each include the plurality of second semiconductor columns arranged in the third direction. The plurality of second semiconductor columns are each opposed to the plurality of first conductive layers and the third conductive layer. Assuming that a cross-section extending in the second direction and the third direction and including one of the plurality of first conductive layers is a first cross-section, and a distance in the second direction between center positions on the first cross-sections of two first semiconductor column rows adjacent in the second direction is a first distance, the fourth conductive layer has a length in the second direction smaller than a length of the second conductive layer in the second direction, a length of the third conductive layer in the second direction, and the first distance.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like in a predetermined direction of a configuration, a member, or the like, this may mean a width, a length, a thickness, or the like in a cross-section or the like observed with a Scanning electron microscopy (SEM), a Transmission electron microscopy (TEM), or the like.

First Embodiment

FIG. 1 is a schematic circuit diagram illustrating a configuration of a semiconductor memory device according to a first embodiment. As illustrated in FIG. 1, the semiconductor memory device according to the embodiment includes a memory cell array MCA and a peripheral circuit PC.

The memory cell array MCA includes a plurality of memory blocks BLK. The plurality of memory blocks BLK each include a plurality of string units SU. The plurality of string units SU each include a plurality of memory strings MS. These plurality of memory strings MS have one ends each connected to the peripheral circuit PC via a bit line BL. These plurality of memory strings MS have other ends each connected to the peripheral circuit PC via a common source line SL.

The memory string MS includes drain-side select transistors STDT, STD, a plurality of memory cells MC (memory transistors), and source-side select transistors STS, STSB. The drain-side select transistors STDT, STD, the plurality of memory cells MC, and the source-side select transistors STS, STSB are connected in series between the bit line BL and the source line SL. Hereinafter, the drain-side select transistors STDT, STD and the source-side select transistors STS, STSB may be simply referred to as select transistors (STDT, STD, STS, STSB).

The memory cell MC is a field-effect type transistor. The memory cell MC includes a part of a semiconductor column, a gate insulating film, and a gate electrode. The part of the semiconductor column functions as a channel region. The gate insulating film includes an electric charge accumulating film. The memory cell MC has a threshold voltage that changes according to an electric charge amount in the electric charge accumulating film. The memory cell MC stores one bit or a plurality of bits of data. Word lines WL are connected to the respective gate electrodes of the plurality of memory cells MC corresponding to one memory string MS. These respective word lines WL are connected to all of the memory strings MS in one memory block BLK in common.

The select transistor (STDT, STD, STS, STSB) is a field-effect type transistor. The select transistor (STDT, STD, STS, STSB) includes a part of the semiconductor column, a gate insulating film, and a gate electrode. The part of the semiconductor column functions as a channel region. The select gate lines (SGDT, SGD, SGS, SGSB) are connected to the respective gate electrodes of the select transistors (STDT, STD, STS, STSB). One drain-side select gate line SGDT is connected to all the memory strings MS in one memory block BLK in common. One drain-side select gate line SGD is connected to all the memory strings MS in one string unit SU in common. One source-side select gate line SGS is connected to all the memory strings MS in one memory block BLK in common. One source-side select gate line SGSB is connected to all the memory strings MS in one memory block BLK in common.

The peripheral circuit PC includes, for example, a voltage generation circuit that generates operating voltages, a voltage transfer circuit that transfers the generated operating voltages to, for example, the selected bit lines BL, word lines WL, source line SL, select gate lines (SGDT, SGD, SGS, SGSB), and the like, a sense amplifier module connected to the bit lines BL, and a sequencer that controls them.

Figure 2:
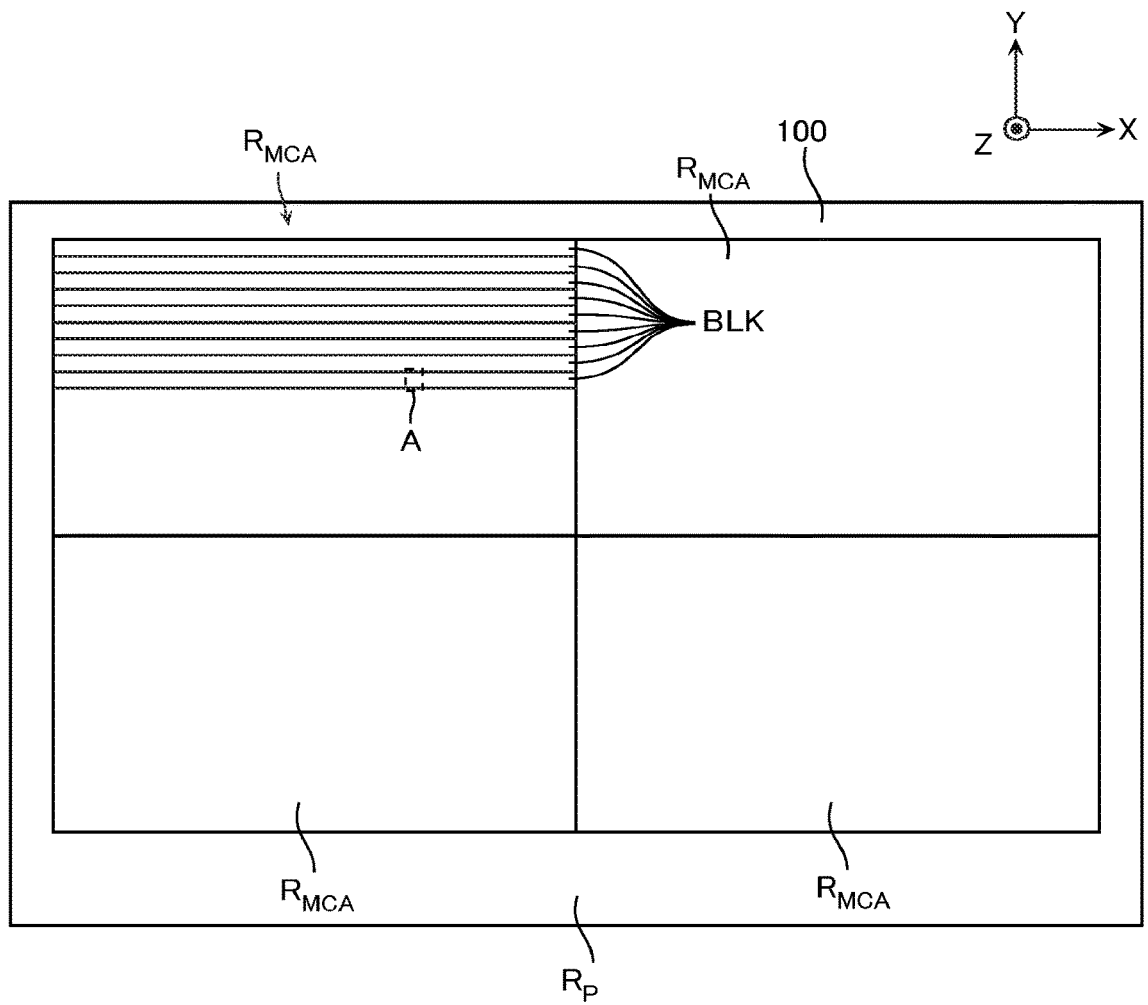
FIG. 2 is a schematic plan view illustrating a configuration of a part of the semiconductor memory device.
Figure 3:
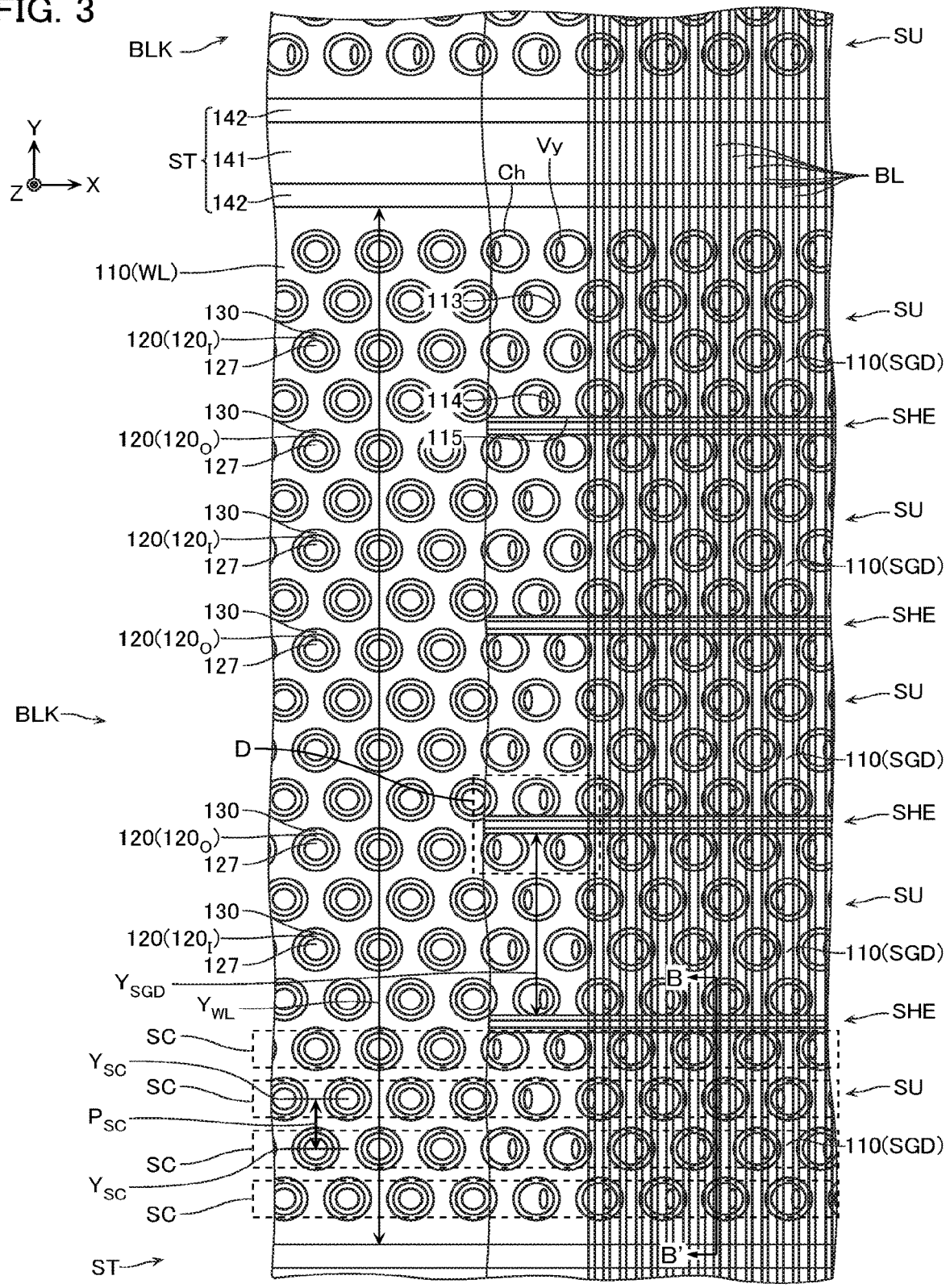
FIG. 3 is a schematic enlarged view of a part indicated by A in FIG. 2.
Figure 4:
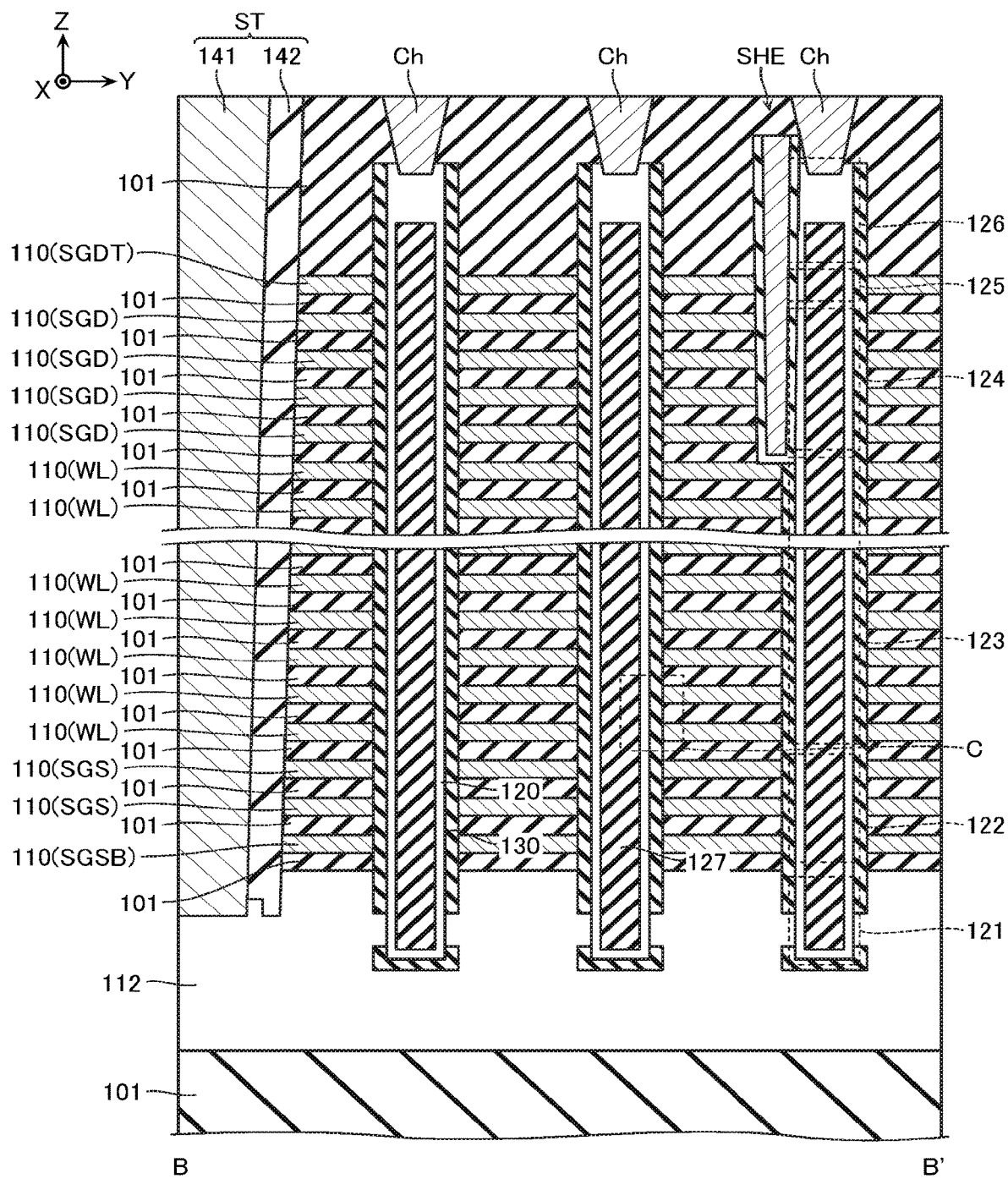
FIG. 4 is a schematic cross-sectional view of the structure illustrated in FIG. 3 taken along the line B-B' and viewed along the direction of the arrow.
Figure 5:
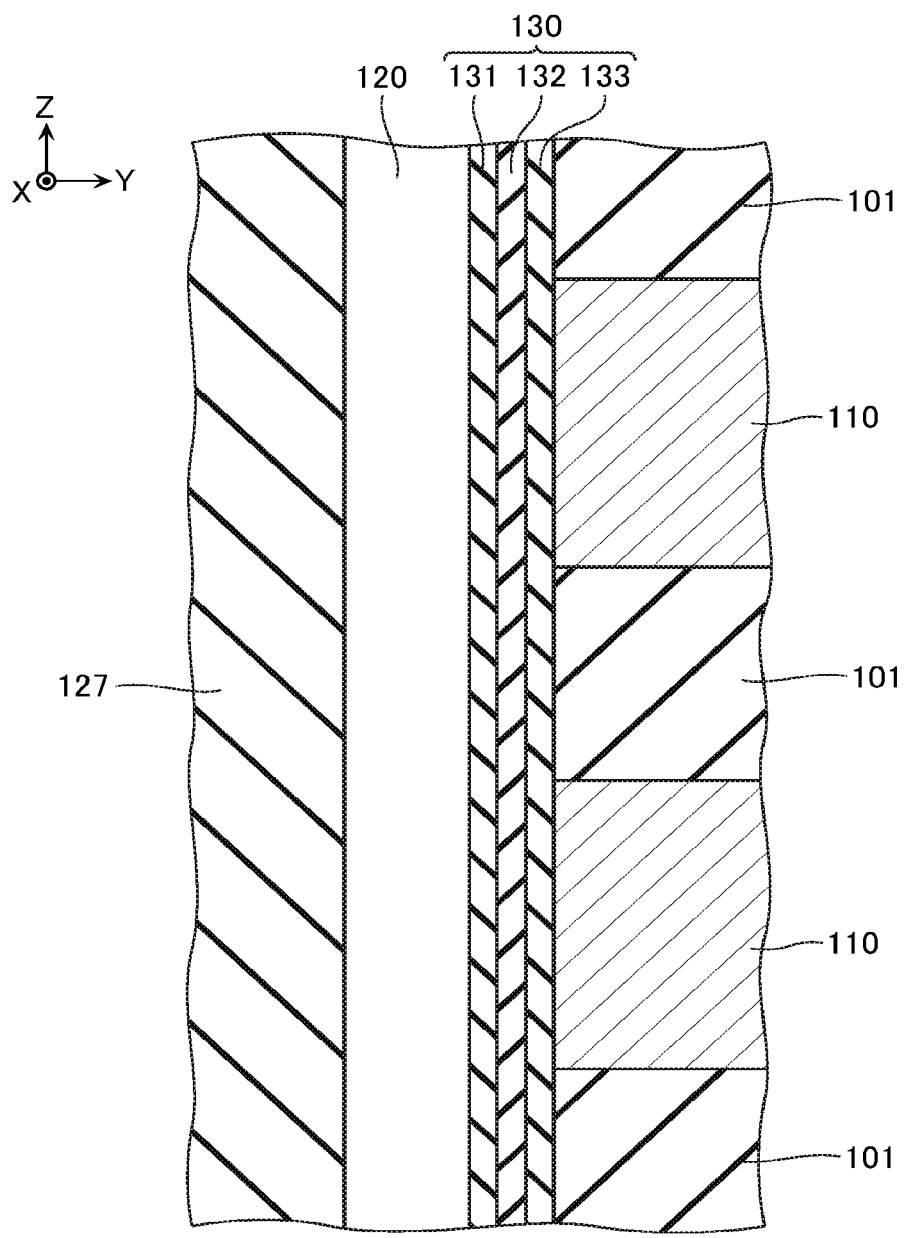
FIG. 5 is a schematic enlarged view of a part indicated by C in FIG. 4.
Figure 6:
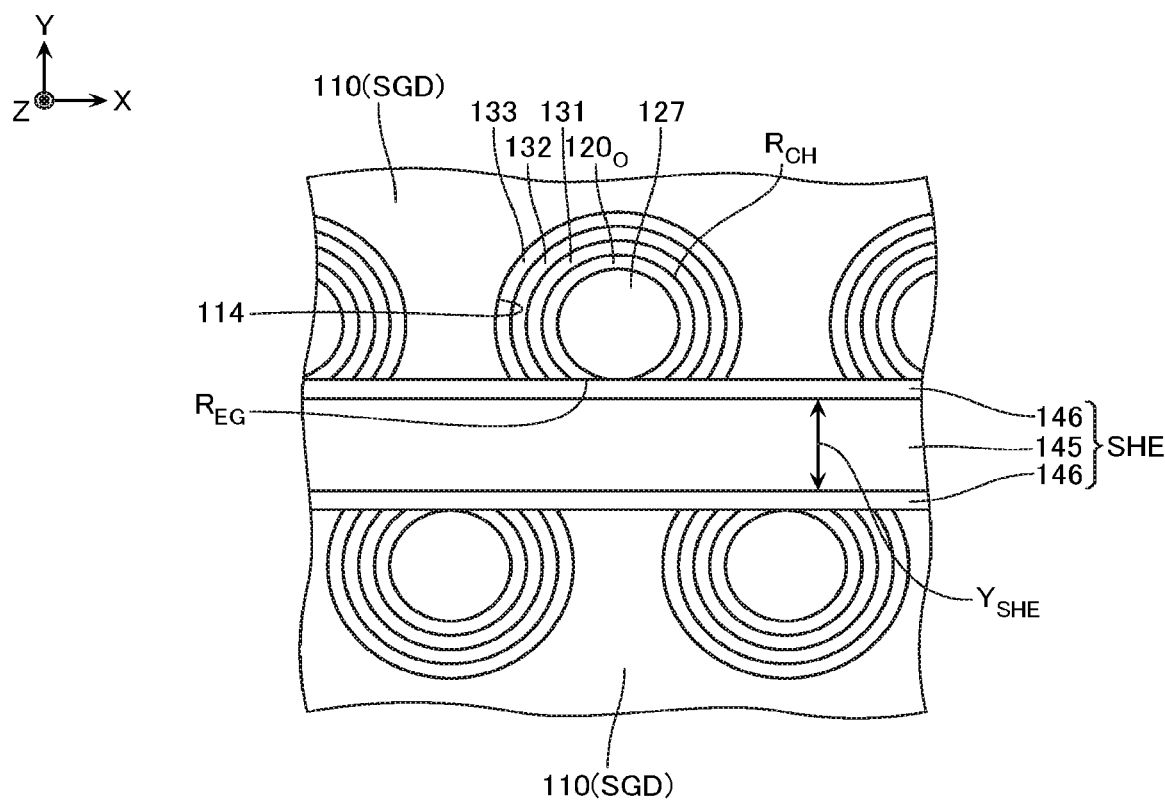
FIG. 6 is a schematic enlarged view corresponding to a part indicated by D in FIG. 3.
Figure 7:
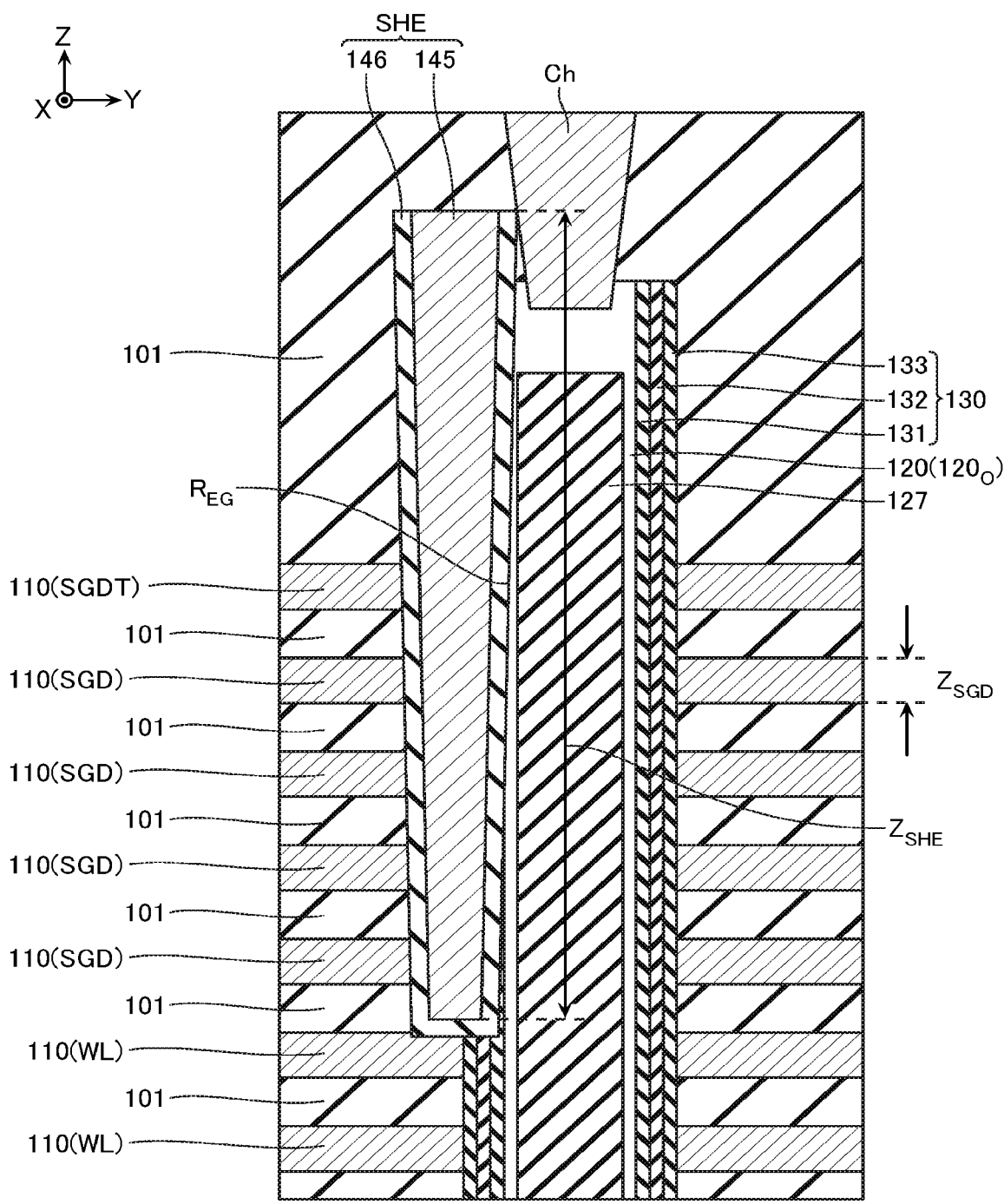
FIG. 7 is a schematic enlarged view illustrating a configuration of a part of FIG. 4.
Figure 8:
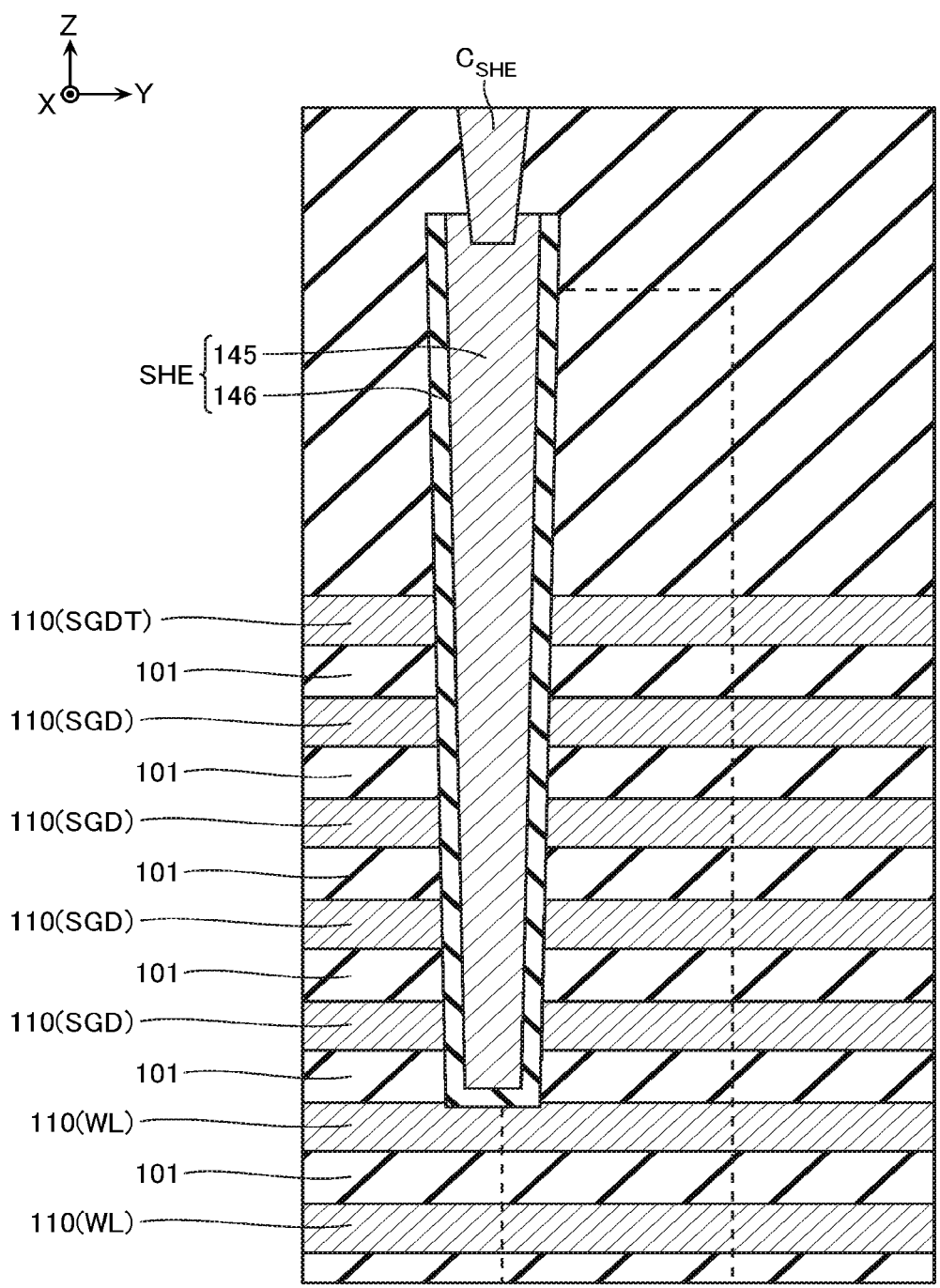
FIG. 8 is a schematic cross-sectional view illustrating a configuration of a part of the semiconductor memory device.

Next, with reference to, FIG. 2 to FIG. 8, an exemplary configuration of a semiconductor memory device according to the first embodiment will be described. FIG. 2 is a schematic plan view illustrating a configuration of a part of the semiconductor memory device. FIG. 3 is a schematic enlarged view of a part indicated by A in FIG. 2. FIG. 4 is a schematic cross-sectional view of a structure illustrated in FIG. 3 taken along the line B-B' and viewed along the direction of the arrow. FIG. 5 is a schematic enlarged view of a part indicated by C in FIG. 4. Note that, while FIG. 5 illustrates a YZ cross-section, a structure similar to FIG. 5 is also observed when a cross-section taken along a central axis of a semiconductor column 120 (for example, an XZ cross-section) other than the YZ cross-section is observed. FIG. 6 is a schematic enlarged view corresponding to a part indicated by D in FIG. 3. FIG. 7 is a schematic enlarged view illustrating a configuration of a part of FIG. 4. FIG. 8 is a schematic cross-sectional view illustrating a configuration of a part of the semiconductor memory device.

The semiconductor memory device according to the first embodiment includes, for example, as illustrated in FIG. 2, a semiconductor substrate 100. In the illustrated example, the semiconductor substrate 100 has four memory cell array regions $R_{MCA}$ arranged in the X-direction and the Y-direction. The four memory cell array regions $R_{MCA}$ each include a plurality of memory blocks BLK arranged in the Y-direction. The semiconductor substrate 100 has an end portion in the Y-direction having a peripheral region $R_P$.

The memory block BLK includes a plurality of string units SU arranged in the Y-direction, for example, as illustrated in FIG. 3. Between two memory blocks BLK adjacent in the Y-direction, an inter-block structure ST is disposed. Between two string units SU adjacent in the Y-direction, an inter-string unit structure SHE is disposed.

The memory block BLK includes, for example, as illustrated in FIG. 4, a plurality of conductive layers 110 arranged in the Z-direction, a plurality of semiconductor columns 120 extending in the Z-direction, and a plurality of gate insulating films 130 respectively disposed between the plurality of conductive layers 110 and the plurality of semiconductor columns 120.

The conductive layer 110 extends in the X-direction. The conductive layer 110 may include a stacked film or the like of a barrier conductive film of, for example, titanium nitride (TiN) and a metal film of, for example, tungsten (W). The conductive layer 110 may, for example, include polycrystalline silicon or the like containing impurities, such as phosphorus (P) or boron (B). Between the plurality of conductive layers 110 arranged in the Z-direction, insulating layers 101 of, for example, silicon oxide ($SiO_2$), is disposed.

Below the conductive layers 110, a conductive layer 112 is disposed. The conductive layer 112 may, for example, include polycrystalline silicon or the like containing impurities, such as phosphorus (P) or boron (B). The conductive layer 112 may have a lower surface on which, for example, a conductive layer of a metal, such as tungsten (W), a conductive layer of tungsten silicide, or another conductive layer is disposed. Between the conductive layer 112 and the conductive layer 110, the insulating layer 101 of, for example, silicon oxide ($SiO_2$), is disposed.

The conductive layer 112 functions as a source line SL (FIG. 1). The source line SL is, for example, disposed in common for all the memory blocks BLK included in the memory cell array region $R_{MCA}$ (FIG. 2).

Among the plurality of conductive layers 110, the one or a plurality of conductive layers 110 positioned at the lowermost layer function as the source-side select gate line SGSB (FIG. 1) and gate electrodes of the plurality of source-side select transistors STSB connected to the source-side select gate line SGSB. These one or a plurality of conductive layers 110 are electrically independent for each memory block BLK. These one or a plurality of conductive layers 110 each include a plurality of through-holes corresponding to the plurality of semiconductor columns 120. These plurality of through-holes have inner peripheral surfaces each surrounding a whole circumference of an outer peripheral surface of the corresponding semiconductor column 120 and being opposed to the outer peripheral surface of the corresponding semiconductor column 120. Note that, in the following description, such a conductive layer 110 is referred to as a conductive layer 110 (SGSB) in some cases.

The one or a plurality of conductive layers 110 positioned above the conductive layer 110 (SGSB) function as the source-side select gate line SGS (FIG. 1) and gate electrodes of the plurality of source-side select transistors STS connected to the source-side select gate line SGS. These one or a plurality of conductive layers 110 are electrically independent for each memory block BLK. These one or a plurality of conductive layers 110 each include a plurality of through-holes corresponding to the plurality of semiconductor columns 120. These plurality of through-holes have inner peripheral surfaces each surrounding the whole circumference of the outer peripheral surface of the corresponding semiconductor column 120 and being opposed to the outer peripheral surface of the corresponding semiconductor column 120. Note that, in the following description, such a conductive layer 110 is referred to as a conductive layer 110 (SGS) in some cases.

The plurality of conductive layers 110 positioned above the conductive layer 110 (SGS) function as the word lines WL (FIG. 1) and gate electrodes of the plurality of memory cells MC (FIG. 1) connected to the word lines WL. These plurality of conductive layers 110 are electrically independent for each memory block BLK. These plurality of conductive layers 110 each include a plurality of through-holes corresponding to the plurality of semiconductor columns 120. These plurality of through-holes have inner peripheral surfaces each surrounding the whole circumference of the outer peripheral surface of the corresponding semiconductor column 120 and being opposed to the outer peripheral surface of the corresponding semiconductor column 120. Note that, in the following description, such a conductive layer 110 is referred to as a conductive layer 110 (WL) in some cases.

The one or a plurality of conductive layers 110 positioned above the conductive layer 110 (WL) function as the drain-side select gate line SGD and gate electrodes of the plurality of drain-side select transistors STD (FIG. 1) connected to the drain-side select gate line SGD. As illustrated in FIG. 3, between two of these conductive layers 110 adjacent in the Y-direction, the inter-string unit structure SHE is disposed. These plurality of conductive layers 110 are each electrically independent for each string unit SU. Note that, in the following description, such a conductive layer 110 is referred to as a conductive layer 110 (SGD) in some cases.

As illustrated in FIG. 3, the conductive layer 110 (SGD) has a length $Y_{SGD}$ in the Y-direction smaller than a length $Y_{WL}$ of the conductive layer 110 (WL) in the Y-direction. For example, in the example in FIG. 3, five conductive layers 110 (SGD) arranged in the Y-direction and four inter-string unit structures SHE arranged in the Y-direction are disposed corresponding to one conductive layer 110 (WL). Accordingly, in the illustrated example, the length $Y_{SGD}$ of the conductive layer 110 (SGD) in the Y-direction is smaller than 1⁄5 of the length $Y_{WL}$ of the conductive layer 110 (WL) in the Y-direction. However, among the five conductive layers 110 (SGD) arranged in the Y-direction corresponding to one memory block BLK, first and fifth conductive layers 110 (SGD) counted from one side in the Y-direction have lengths in the Y-direction that may be larger than the lengths $Y_{SGD}$ of the other three conductive layers 110 (SGD) in the Y-direction or may be larger than 1⁄5 of the length $Y_{WL}$ of the conductive layer 110 (WL) in the Y-direction.

The conductive layers 110 (SGD) each have a plurality of through-holes 113 corresponding to the plurality of semiconductor columns 120 and a plurality of recessed portions 114 corresponding to the plurality of semiconductor columns 120. The plurality of through-holes 113 have inner peripheral surfaces each surrounding the whole circumference of the outer peripheral surface of the corresponding semiconductor column 120 and being opposed to the outer peripheral surface of the corresponding semiconductor column 120. The plurality of recessed portions 114 are each connected to a side surface 115 of the conductive layer 110 (SGD) in the Y-direction and are opposed to a part of the outer peripheral surface of the corresponding semiconductor column 120.

The one or a plurality of conductive layers 110 positioned above the conductive layers 110 (SGD) function as the drain-side select gate line SGDT and gate electrodes of the plurality of drain-side select transistors STDT (FIG. 1) connected to the drain-side select gate line SGDT. In the following description, such a conductive layer 110 is referred to as a conductive layer 110 (SGDT). The conductive layer 110 (SGDT) is basically configured similarly to the conductive layer 110 (SGD). However, the plurality of conductive layers 110 (SGDT) included in one memory block BLK is electrically connected to one another via a wiring and the like.

The semiconductor column 120 is arranged in a predetermined pattern in the X-direction and the Y-direction, for example, as illustrated in FIG. 3. For example, the memory block BLK includes twenty semiconductor column rows SC disposed from one side in the Y-direction toward the other side in the Y-direction. These twenty semiconductor column rows SC each include the plurality of semiconductor columns 120 arranged in the X-direction. These twenty semiconductor column rows SC are arranged in the Y-direction at a pitch $P_{SC}$. That is, when two semiconductor column rows SC adjacent in the Y-direction are focused on, a center position $Y_{SC}$ of one semiconductor column row SC in the Y-direction and a center position $Y_{SC}$ of the other semiconductor column row SC in the Y-direction are spaced by a distance equal to the pitch $P_{SC}$ in the Y-direction.

Note that the pitch $P_{SC}$ can be defined by various kinds of methods.

For example, an XY cross-section corresponding to the conductive layer 110 (WL) as exemplarily illustrated in FIG. 3 is observed by means, such as a SEM and a TEM, the center positions $Y_{SC}$ in the Y-direction of the twenty semiconductor column rows SC corresponding to the focused memory block BLK are measured on this XY cross-section, nineteen distances corresponding to these twenty center positions $Y_{SC}$ are measured, and an average value or a medium value of these nineteen distances may be used as the pitch $P_{SC}$. For example, on this XY cross-section, the center positions $Y_{SC}$ in the Y-direction of four semiconductor column rows SC corresponding to the focused string unit SU are measured, three distances corresponding to these four center positions $Y_{SC}$ are measured, and an average value or a medium value of these three distances may be used as the pitch $P_{SC}$.

The center position $Y_{SC}$ of the semiconductor column row SC in the Y-direction can be defined by various kinds of methods. For example, an XY cross-section as exemplarily illustrated in FIG. 3 is observed by means, such as a SEM and a TEM, a center position in the Y-direction of at least one semiconductor column 120 included in the focused semiconductor column row SC is measured on this XY cross-section, and any one of the center position, an average value of a plurality of the center positions, or a medium value of the plurality of center positions may be used as the center position $Y_{SC}$ of the semiconductor column row SC in the Y-direction. The center position of the semiconductor column 120 in the Y-direction may be a position in the Y-direction at a center point of a circumscribed circle of the semiconductor column 120 on this XY cross-section or may be a position of a centroid in the Y-direction of an image of the semiconductor column 120.

The semiconductor columns 120 corresponding to first, 4n-th (n is an integer of one or more and four or less), 4n+1-th, and twentieth semiconductor column rows SC counted from one side in the Y-direction are hereinafter referred to as semiconductor columns $120_o$ in some cases. The semiconductor columns 120 corresponding to second, third, 4n+2-th, and 4n+3-th semiconductor column rows SC counted from the one side in the Y-direction are referred to as semiconductor columns $120_I$ in some cases.

The semiconductor column 120, for example, includes polycrystalline silicon (Si) and the like. The semiconductor column 120 has, for example, as illustrated in FIG. 4, an approximately cylindrical shape and has a center portion having an insulating layer 127 of, for example, silicon oxide ($SiO_2$).

The semiconductor column 120 has a region 121 disposed at a lower end, a region 122 opposed to the one or a plurality of conductive layers 110 (SGSB) and the one or a plurality of conductive layers 110 (SGS), a region 123 opposed to the plurality of conductive layers 110 (WL), a region 124 opposed to the one or a plurality of conductive layers 110 (SGD), a region 125 opposed to the one or a plurality of conductive layers 110 (SGDT), and a region 126 disposed at an upper end.

The region 121 includes N-type impurities, such as phosphorus (P). The region 121 has an approximately cylindrical shape. The region 121 is connected to the conductive layer 112.

The region 122 functions as channel regions of the source-side select transistors STSB, STS. The region 122 has a lower end portion that may include N-type impurities, such as phosphorus (P). The other portion of the region 122 does not necessarily include the N-type impurities, such as phosphorus (P). The region 122 has an approximately cylindrical shape.

The region 123 functions as a channel region of the memory cell MC. The region 123 does not necessarily include N-type impurities, such as phosphorus (P). The region 123 has an approximately cylindrical shape.

The region 124 functions as a channel region of the drain-side select transistor STD. The region 124 does not necessarily include N-type impurities, such as phosphorus (P).

Here, in the example in FIG. 3, the semiconductor column $120_I$ is spaced from the inter-string unit structure SHE. The region 124 of the semiconductor column $120_I$ has an approximately cylindrical shape. The region 124 of the semiconductor column $120_I$ has an outer peripheral surface opposed to the inner peripheral surface of the above-described through-hole 113 disposed in the conductive layer 110 (SGD).

In the example in FIG. 3, the semiconductor column $120_o$ is in contact with the inter-string unit structure SHE. The region 124 of the semiconductor column $120_o$ may have an approximately cylindrical shape or, for example, as illustrated in FIG. 6, may have an arc shape on an XY plane. A part of the region on the outer peripheral surface of the region 124 of the semiconductor column $120_o$ is opposed to the above-described recessed portion 114 disposed in the conductive layer 110 (SGD). Such a region is hereinafter referred to as a region $R_{CH}$ in some cases. The other region on the outer peripheral surface of the region 124 of the semiconductor column $120_o$ is opposed to the inter-string unit structure SHE. Such a region is referred to as a region $R_{EG}$ in some cases below.

The region 125 (FIG. 4) functions as a channel region of the drain-side select transistor STDT. The region 125 has an upper end portion that may include N-type impurities, such as phosphorus (P). The other portion of the region 125 does not necessarily include N-type impurities, such as phosphorus (P). The region 125 of the semiconductor column $120_I$ has an approximately cylindrical shape. The region 125 of the semiconductor column $120_o$ may have an approximately cylindrical shape or may have an arc shape on an XY plane.

The region 126 (FIG. 4) includes N-type impurities, such as phosphorus (P). The region 126 may have an approximately columnar shape. The region 126 is connected to the bit line BL via a contact Ch and a contact Vy (FIG. 3) extending in the Z-direction. The contact Ch and the contact Vy may, for example, include a stacked film or the like of a barrier conductive film of, for example, titanium nitride (TiN) and a metal film of, for example, tungsten (W). The bit line BL may, for example, include a stacked film or the like of a barrier conductive film of, for example, titanium nitride (TiN) and a metal film of, for example, copper (Cu).

The gate insulating film 130 has an approximately cylindrical shape covering the outer peripheral surface of the semiconductor column 120. The gate insulating film 130 includes a tunnel insulating film 131, an electric charge accumulating film 132, and a block insulating film 133 stacked between the semiconductor column 120 and the conductive layer 110, for example, as illustrated in FIG. 5. The tunnel insulating film 131 and the block insulating film 133 includes, for example, silicon oxide ($SiO_2$) or the like. The electric charge accumulating film 132 is, for example, a film, which can accumulate an electric charge of, for example, silicon nitride (SiN). The tunnel insulating film 131, the electric charge accumulating film 132, and the block insulating film 133 have an approximately cylindrical shape and extend in the Z-direction along the outer peripheral surface of the semiconductor column 120 excluding a part of certain regions. For example, as illustrated in FIG. 4, at a contact portion between the semiconductor column 120 and the conductive layer 112, the tunnel insulating film 131, the electric charge accumulating film 132, and the block insulating film 133 are not disposed. For example, as illustrated in FIG. 6 and FIG. 7, in the region $R_{EG}$ of the outer peripheral surface of the semiconductor column $120_o$, the tunnel insulating film 131, the electric charge accumulating film 132, and the block insulating film 133 are not necessarily disposed.

Note that FIG. 5 illustrates the example in which the gate insulating film 130 includes the electric charge accumulating film 132 of, for example, silicon nitride. However, the gate insulating film 130 may, for example, include a floating gate of, for example, polycrystalline silicon containing N-type or P-type impurities.

The inter-block structure ST, for example, as illustrated in FIG. 3 and FIG. 4, includes a conductive layer 141 extending in the X-direction and the Z-direction and insulating layers 142 of, for example, silicon oxide ($SiO_2$) disposed on side surfaces of the conductive layer 141 in the Y-direction. The conductive layer 141 has a lower end connected to the conductive layer 112. The conductive layer 141 has an upper end positioned above the upper surface of the conductive layer 110 positioned at the uppermost layer. The conductive layer 141 may, for example, include a stacked film or the like of a barrier conductive film of, for example, titanium nitride (TiN) and a metal film of, for example, tungsten (W). The conductive layer 141 may, for example, include polycrystalline silicon or the like containing impurities, such as phosphorus (P) or boron (B). The conductive layer 141 functions, for example, as a part of the source line SL (FIG. 1).

The inter-string unit structure SHE includes, for example, as illustrated in FIG. 6 and FIG. 7, a conductive layer 145 extending in the X-direction and the Z-direction and insulating layers 146 of, for example, silicon oxide ($SiO_2$) disposed on side surfaces of the conductive layer 145 in the Y-direction. The conductive layer 145 has a length $Y_{SHE}$ (FIG. 6) in the Y-direction smaller than a length $Y_{SGD}$ (FIG. 3) of the conductive layer 110 (SGD) and the conductive layer 110 (SGDT) in the Y-direction. The length $Y_{SHE}$ (FIG. 6) of the conductive layer 145 in the Y-direction is smaller than the pitch $P_{SC}$ (FIG. 3) of the plurality of semiconductor column rows SC in the Y-direction. While the conductive layer 145 is disposed between the semiconductor columns $120_o$ included in two semiconductor column rows SC adjacent in the Y-direction, the conductive layer 145 itself is not provided with through-holes corresponding to the semiconductor columns 120.

The conductive layer 145 has a length $Z_{SHE}$ (FIG. 7) in the Z-direction larger than a length $Z_{SGD}$ of the conductive layer 110 (SGD) in the Z-direction. As illustrated in FIG. 7, the conductive layer 145 has a lower end positioned above the upper surface of the conductive layer 110 (WL) positioned at the uppermost layer. The conductive layer 145 has a lower end positioned below the lower surface of the conductive layer 110 (SGD) positioned at the lowermost layer. The upper end of the conductive layer 145 is positioned above the upper surface of the conductive layer 110 positioned at the uppermost layer and the upper end of the semiconductor column 120. The conductive layer 145 may, for example, include a stacked film or the like of a barrier conductive film of, for example, titanium nitride (TiN) and a metal film of, for example, tungsten (W). The conductive layer 145 may, for example, include polycrystalline silicon or the like containing impurities, such as phosphorus (P) or boron (B).

Note that, as illustrated in FIG. 8, the upper surface of the conductive layer 145 is connected to a contact $C_{SHE}$ extending in the Z-direction. The contact $C_{SHE}$ may, for example, include a stacked film or the like of a barrier conductive film of, for example, titanium nitride (TiN) and a metal film of, for example, tungsten (W). The conductive layer 145 is connected to the peripheral circuit PC (FIG. 1) via the contact $C_{SHE}$. The peripheral circuit PC is configured to be able to apply a ground voltage $V_{SS}$ to the conductive layer 145. The peripheral circuit PC may be configured to be able to apply a voltage other than the ground voltage $V_{SS}$ to the conductive layer 145. For example, upon a read operation and a write operation, the conductive layer 145 is applied with the ground voltage $V_{SS}$ or another voltage.

[Read Operation]

Figure 9:
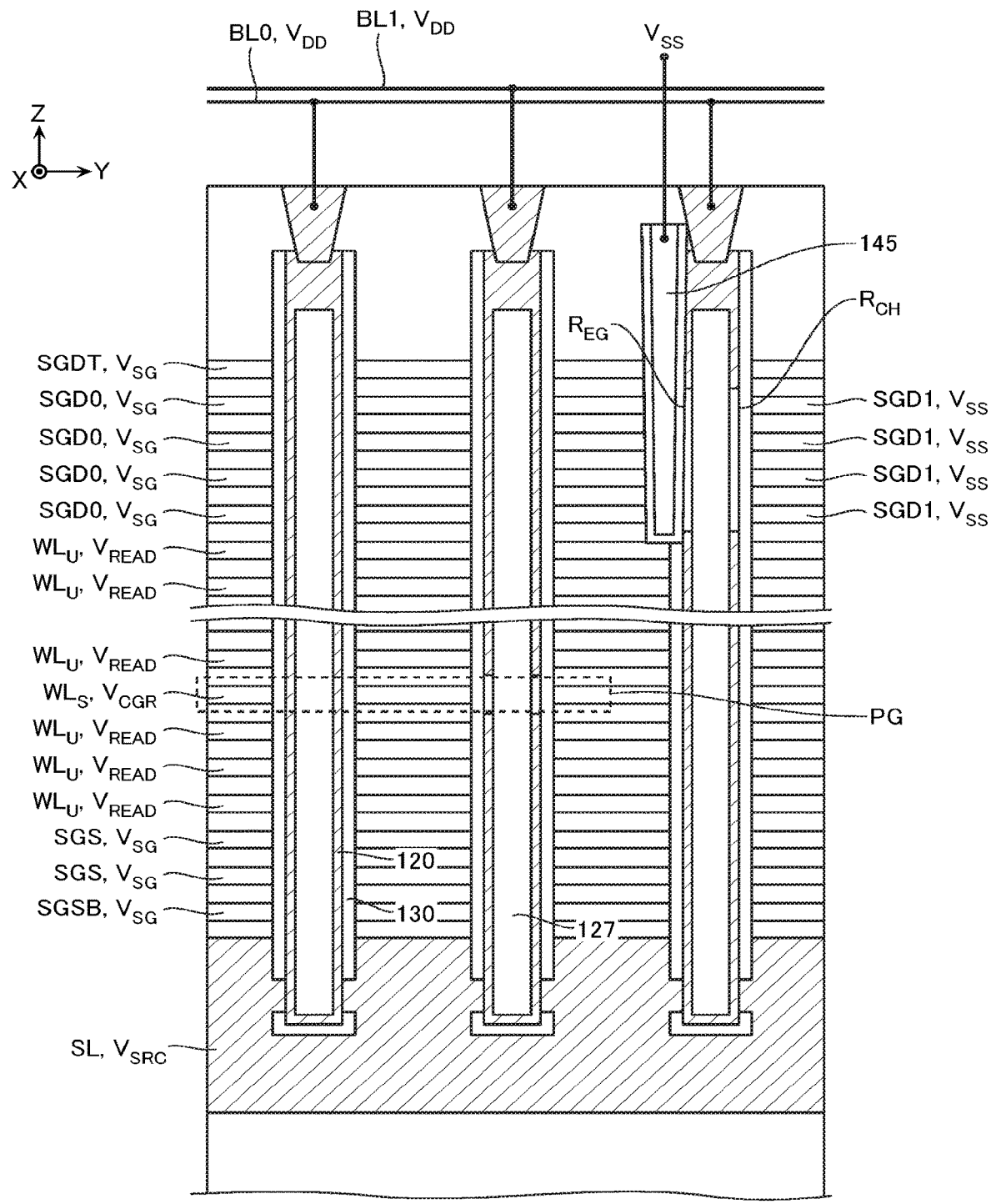
FIG. 9 is a schematic cross-sectional view for describing a read operation of the semiconductor memory device.

Next, with reference to FIG. 9, a read operation of the semiconductor memory device according to the embodiment will be described. FIG. 9 is a schematic cross-sectional view for describing the read operation.

Note that, in the following description, the word line WL as an operation target is referred to as a selected word line $WL_S$, and the other word lines WL are referred to as unselected word lines $WL_U$ in some cases. In the following description, among the plurality of memory cells MC included in the string unit SU as operation targets, the memory cells MC connected to the selected word line $WL_S$ are referred to as selected memory cells MC in some cases. In the following description, the configuration including such a plurality of the selected memory cells MC are referred to as a selected page PG in some cases. In the following description, a drain-side select gate line SGD0 corresponds to the string unit SU as the operation target and a drain-side select gate line SGD1 corresponds to the string unit SU that is not the operation target.

In a read operation, for example, bit lines BL (exemplified as bit lines BL0, BL1 in FIG. 9) are applied with a voltage $V_{DD}$ and the source line SL is applied with a voltage $V_{SRO}$. The voltage $V_{DD}$ is larger than the voltage $V_{SRO}$. The voltage $V_{SRC}$ is larger than the ground voltage $V_{SS}$.

In the read operation, for example, the drain-side select gate lines SGD0, SGDT are applied with the voltage $V_{SG}$. The voltage $V_{SG}$ is larger than the voltage $V_{DD}$. The difference between the voltage $V_{DD}$ and the voltage $V_{SG}$ is larger than a threshold voltage of the drain-side select transistors STD, STDT. Accordingly, the drain-side select transistor STD connected to the drain-side select gate line SGD0 is turned into ON state. The drain-side select transistor STDT is turned into ON state.

In the read operation, for example, the ground voltage $V_{SS}$ is applied to the drain-side select gate line SGD1. In such a case, electron channels are not formed on the outer peripheral surfaces of the plurality of semiconductor columns $120_I$ opposed to the drain-side select gate line SGD1. Also, the electron channels are not formed in the regions $R_{CH}$ on the outer peripheral surfaces of the plurality of semiconductor columns $120_o$ opposed to the drain-side select gate line SGD1.

In the read operation, for example, the above-described conductive layer 145 is applied with the ground voltage $V_{SS}$. In such a case, the electron channels are not formed in the region $R_{EG}$ on the outer peripheral surface of the plurality of semiconductor columns $120_o$ opposed to the drain-side select gate line SGD1. Accordingly, the drain-side select transistor STD connected to the drain-side select gate line SGD1 are turned into OFF state. Note that the voltage applied to the conductive layer 145 may be a voltage other than the ground voltage $V_{SS}$ as long as the voltage has a magnitude that does not form the electron channels in the regions $R_{EG}$ on the outer peripheral surfaces of the plurality of semiconductor columns $120_o$ opposed to the drain-side select gate line SGD1.

In the read operation, for example, the source-side select gate lines SGSB, SGS are applied with the voltage $V_{SG}$. The voltage $V_{SG}$ is larger than the voltage $V_{SGC}$. The difference between the voltage $V_{SG}$ and the voltage $V_{SRC}$ is larger than a threshold voltage of the source-side select transistors STSB, STS. Accordingly, the source-side select transistors STSB, STS are turned into ON state.

In the read operation, for example, the unselected word line $WL_U$ is applied with a read pass voltage $V_{READ}$. The read pass voltage $V_{READ}$ is larger than the voltage $V_{DD}$ and the voltage $V_{SRC}$. The difference between the read pass voltage $V_{READ}$ and the voltages $V_{DD}$, $V_{SRC}$ is larger than a threshold voltage of the memory cell MC regardless of data stored in the memory cell MC. Accordingly, the memory cells MC connected to the unselected word line $WL_U$ are turned into ON state.

In the read operation, for example, the selected word line $WL_S$ is applied with a predetermined read voltage $V_{CGR}$. The difference between the read voltage $V_{CGR}$ and the voltage $V_{SRC}$ is larger than threshold voltages of the memory cells MC in which certain data is written and is smaller than threshold voltages of the memory cell MC in which the other data is written. Accordingly, the memory cells MC connected to the selected word line $WL_S$ are turned into ON state or OFF state corresponding to the stored data. This electrically conducts the bit line BL0 to the source line SL, and a current flows in such a bit line BL0. The bit line BL1 is not electrically conducted to the source line SL, and a current does not flow in such a bit line BL1.

In the read operation, for example, a sense amplifier module inside the peripheral circuit PC (FIG. 1) measures currents or voltages of the bit lines BL0, BL1, and this detects data stored in the memory cell MC.

[Write Operation]

Figure 10:
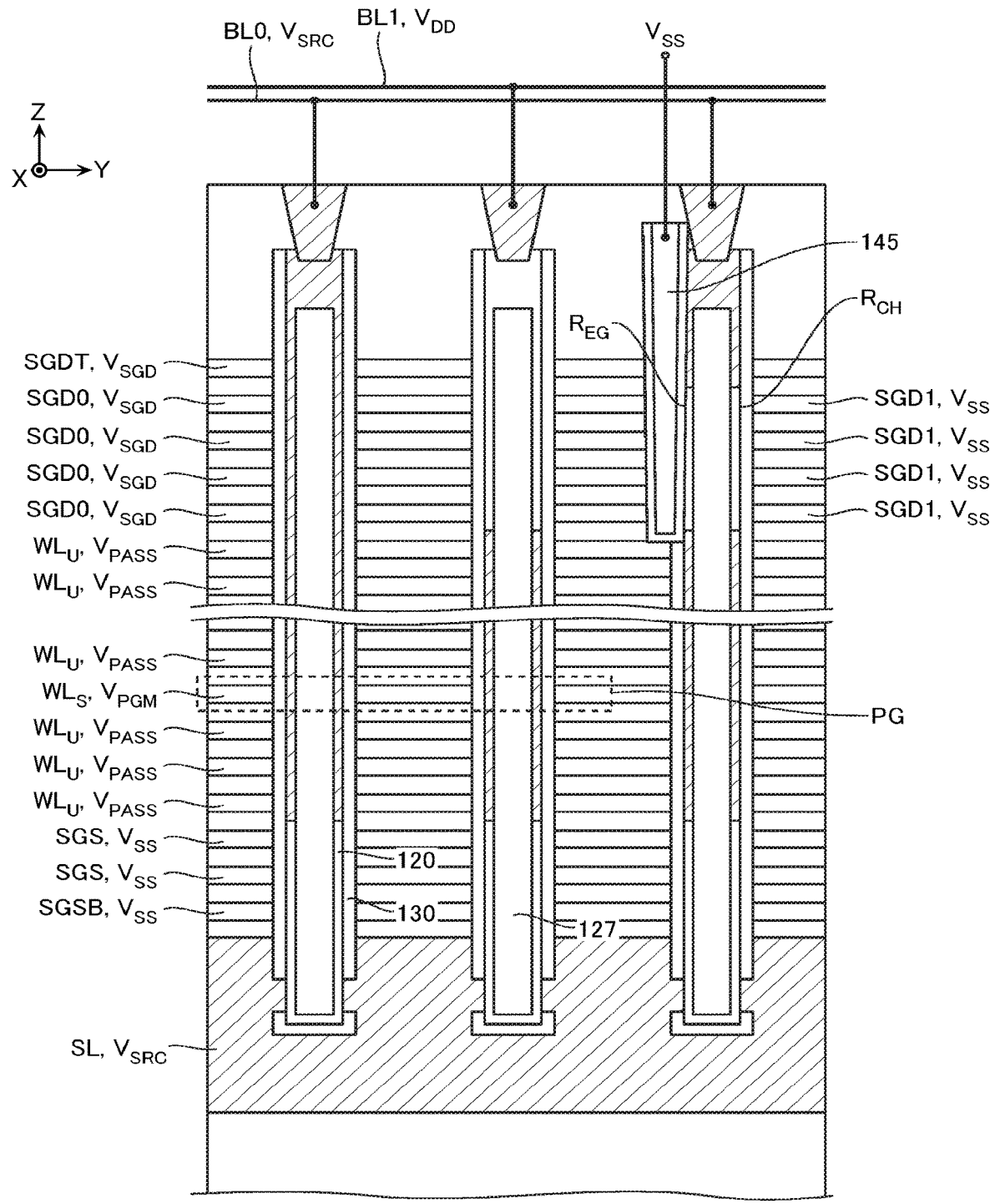
FIG. 10 is a schematic cross-sectional view for describing a write operation of the semiconductor memory device.

Next, with reference to FIG. 10, a write operation of the semiconductor memory device according to the embodiment will be described. FIG. 10 is a schematic cross-sectional view for describing the write operation.

In the write operation, for example, the bit line BL0 is applied with the voltage $V_{SRC}$, and the bit line BL1 is applied with the voltage $V_{DD}$.

In the write operation, for example, the drain-side select gate lines SGD0, SGDT are applied with the voltage $V_{SGD}$. The voltage $V_{SGD}$ is larger than the voltage $V_{SRC}$ and smaller than the voltage $V_{SG}$ (FIG. 9). The difference between the voltage $V_{SGD}$ and the voltage $V_{SRC}$ is larger than the threshold voltage of the drain-side select transistors STD, STDT. Accordingly, the drain-side select transistor STD connected to the drain-side select gate line SGD0 and the bit line BL0 is turned into ON state. The drain-side select transistor STDT connected to the bit line BL0 is turned into ON state. On the other hand, the difference between the voltage $V_{SGD}$ and the voltage $V_{DD}$ is smaller than the threshold voltage of the drain-side select transistors STD, STDT. Accordingly, the drain-side select transistor STD connected to the drain-side select gate line SGD0 and the bit line BL1 is turned into OFF state. The drain-side select transistor STDT connected to the bit line BL1 is turned into OFF state.

In the write operation, for example, the drain-side select gate line SGD1 is applied with the ground voltage $V_{SS}$. In such a case, the electron channels are not formed on the outer peripheral surfaces of the plurality of semiconductor columns $120_I$ opposed to the drain-side select gate line SGD1. Also, the electron channels are not formed in the regions $R_{CH}$ on the outer peripheral surfaces of the plurality of semiconductor columns $120_o$ opposed to the drain-side select gate line SGD1.

In the write operation, for example, the above-described conductive layer 145 is applied with the ground voltage $V_{SS}$. In such a case, the electron channels are not formed also in the regions $R_{EG}$ on the outer peripheral surfaces of the plurality of semiconductor columns $120_o$ opposed to the drain-side select gate line SGD1. Accordingly, the drain-side select transistor STD connected to the drain-side select gate line SGD1 is turned into OFF state. Note that the voltage applied to the conductive layer 145 may be a voltage other than the ground voltage $V_{SS}$ as long as the voltage has a magnitude that does not form the electron channels in the regions $R_{EG}$ on the outer peripheral surfaces of the plurality of semiconductor columns $120_o$ opposed to the drain-side select gate line SGD1.

In the write operation, for example, the source-side select gate lines SGSB, SGS are applied with the ground voltage $V_{SS}$. This turns the source-side select transistors STSB, STS into OFF state.

In the write operation, for example, the unselected word line $WL_U$ is applied with a write pass voltage $V_{PASS}$. The write pass voltage $V_{PASS}$ may be larger than the read pass voltage $V_{READ}$ or may be as large as the read pass voltage $V_{READ}$. The difference between the write pass voltage $V_{PASS}$ and the voltages $V_{DD}$, $V_{SRC}$ is larger than the threshold voltage of the memory cell MC regardless of data stored in the memory cell MC. Accordingly, the memory cells MC connected to the unselected word lines $WL_U$ are turned into ON state.

In the write operation, for example, the selected word line $WL_S$ is applied with a predetermined program voltage $V_{PGM}$. The program voltage $V_{PGM}$ is larger than the write pass voltage $V_{PASS}$.

Here, the channel of the semiconductor column 120 connected to the bit line BL0 is applied with the voltage V. Between such a semiconductor column 120 and the selected word line $WL_S$, a relatively large electric field is generated. This causes the electrons in the channel of the semiconductor column 120 to tunnel into the electric charge accumulating film 132 (FIG. 5) via the tunnel insulating film 131 (FIG. 5). This increases the threshold voltage of the selected memory cell MC connected to the bit line BL0.

On the other hand, the channel of the semiconductor column 120 connected to the bit line BL1 is in an electrically floating state, and this channel voltage is increased up to approximately the write pass voltage $V_{PASS}$ by capacitive coupling with the unselected word lines $WL_U$. Between such a semiconductor column 120 and selected word line $WL_S$, only an electric field smaller than the above-described electric field is generated.

Accordingly, the electrons in the channel of the semiconductor column 120 do not tunnel into the electric charge accumulating film 132 (FIG. 5). Accordingly, the threshold voltage of the memory cell MC connected to the bit line BL1 is not increased.

[Erase Operation]

Figure 11:
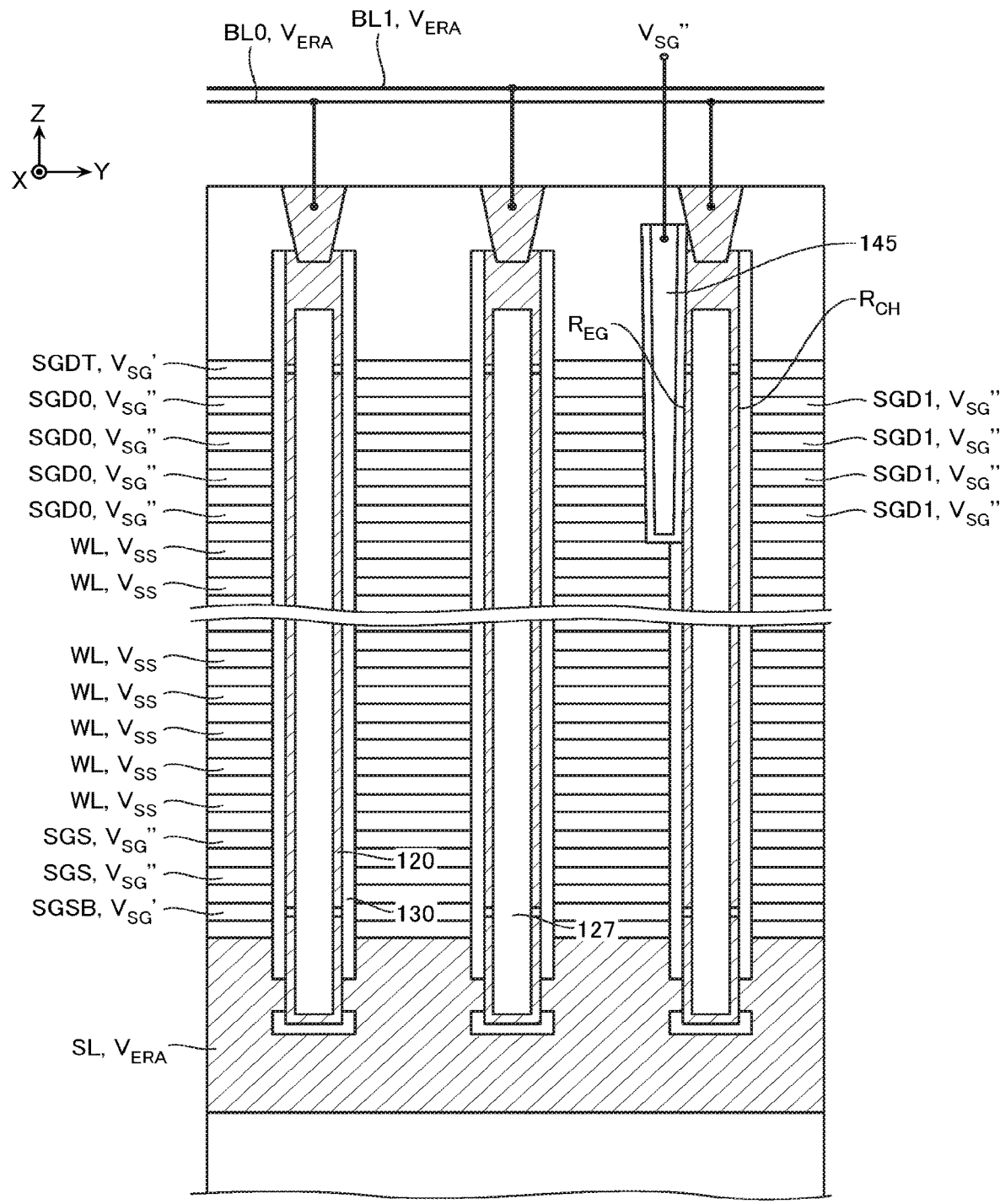
FIG. 11 is a schematic cross-sectional view for describing an erase operation of the semiconductor memory device.

Next, with reference to FIG. 11, an erase operation of the semiconductor memory device according to the embodiment will be described. FIG. 11 is a schematic cross-sectional view for describing the erase operation.

In the erase operation, for example, the bit lines BL0, BL1, and the source line SL are applied with an erase voltage $V_{ERA}$. The erase voltage $V_{ERA}$ is larger than the above-described write pass voltage $V_{PASS}$. The erase voltage $V_{ERA}$ may be as large as the above-described program voltage $V_{PGM}$ or may be larger or smaller than the program voltage $V_{PGM}$.

Upon the erase operation, for example, the drain-side select gate line SGDT is applied with a voltage $V_{SG}'$. The voltage $V_{SG}'$ is smaller than the erase voltage $V_{ERA}$. This generates a Gate Induced Drain Leakage (GIDL) on the outer peripheral surfaces of the plurality of semiconductor columns $120_I$ and a portion opposed to the drain-side select gate line SGDT of the plurality of semiconductor columns $120_o$, and electron and hole pairs are generated. The electrons move to a side of the bit lines BL0, BL1, and the holes move to a side of the memory cell MC.

Upon the erase operation, for example, the drain-side select gate lines SGD0, SGD1 are applied with a voltage $V_{SG}''$. The voltage $V_{SG}''$ is smaller than the erase voltage $V_{ERA}$. The voltage $V_{SG}''$ may be equal to the voltage $V_{SG}'$ or may be larger than the voltage $V_{SG}''$. The voltage difference between the erase voltage $V_{ERA}$ and the voltage $V_{SG}''$ is larger than an absolute value of the threshold voltage when the drain-side select transistor STD is functioned as a PMOS transistor. Accordingly, hole channels are formed on the outer peripheral surfaces of the plurality of semiconductor columns $120_I$ opposed to the drain-side select gate lines SGD0, SGD1 and in the regions $R_{CH}$ on the outer peripheral surfaces of the plurality of semiconductor columns $120_o$ opposed to the drain-side select gate lines SGD0, SGD1. Accordingly, the drain-side select transistor STD is turned into ON state.

Upon the erase operation, for example, the above-described conductive layer 145 is applied with the voltage $V_{SG}''$. In such a case, the hole channels are formed also in the regions $R_{EG}$ on the outer peripheral surfaces of the plurality of semiconductor columns $120_o$. Note that the voltage applied to the conductive layer 145 is adjustable as necessary. For example, the conductive layer 145 may be applied with the voltage $V_{SG}'$. The conductive layer 145 may be turned into floating state.

Upon the erase operation, for example, the source-side select gate line SGSB is applied with the voltage $V_{SG}'$. This generates GIDL in the channel regions of the source-side select transistors STSB, and electron and hole pairs are generated. The electrons move to the source line SL side and the holes move to the memory cell MC side.

Upon the erase operation, for example, the source-side select gate line SGS is applied with the voltage $V_{SG}''$. This turns the source-side select transistor STS into ON state.

Upon the erase operation, for example, the word line WL is applied with the ground voltage $V_{SS}$.

Here, the holes are supplied to the channel region in the semiconductor column 120. Between such a channel and the word line WL, a relatively large electric field is generated. This causes the holes in the channel of the semiconductor column 120 to tunnel into the electric charge accumulating film 132 (FIG. 5) via the tunnel insulating film 131 (FIG. 5). This decreases the threshold voltage of the memory cell MC.

[Comparative Example]

Figure 12:
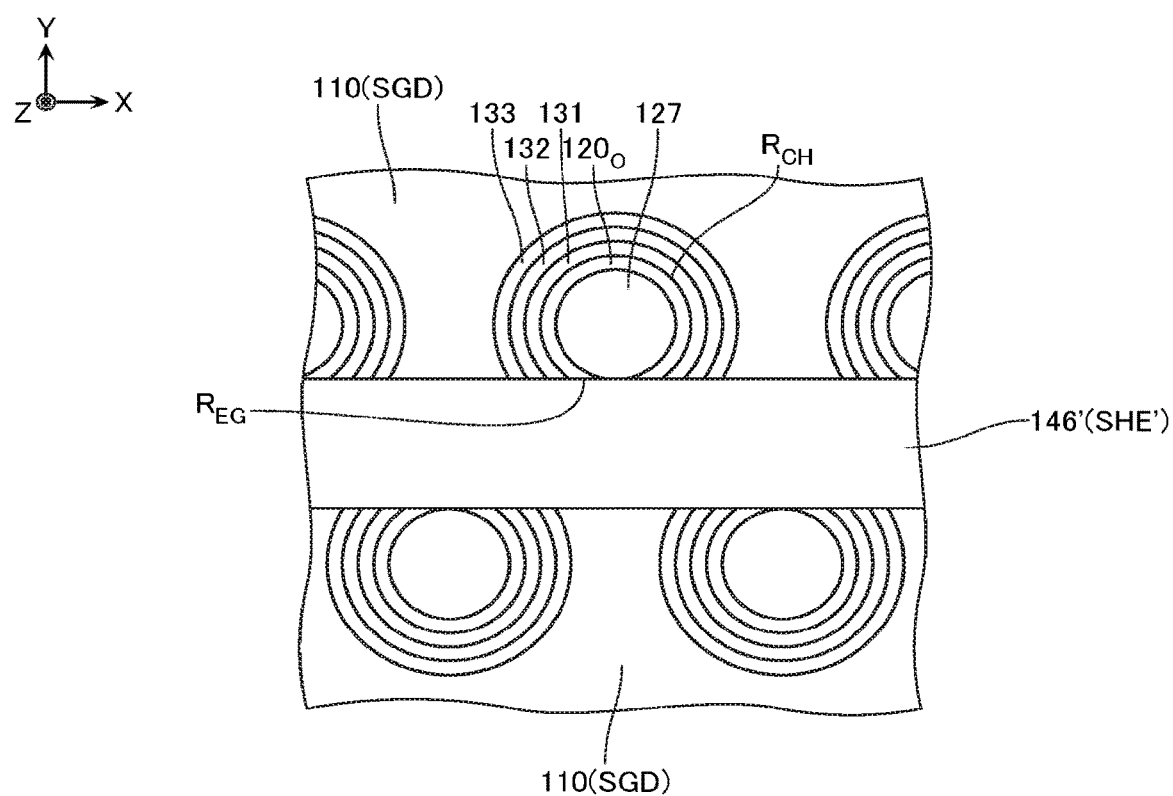
FIG. 12 is a schematic plan view illustrating a configuration of a part of a semiconductor memory device according to a comparative example.
Figure 13:
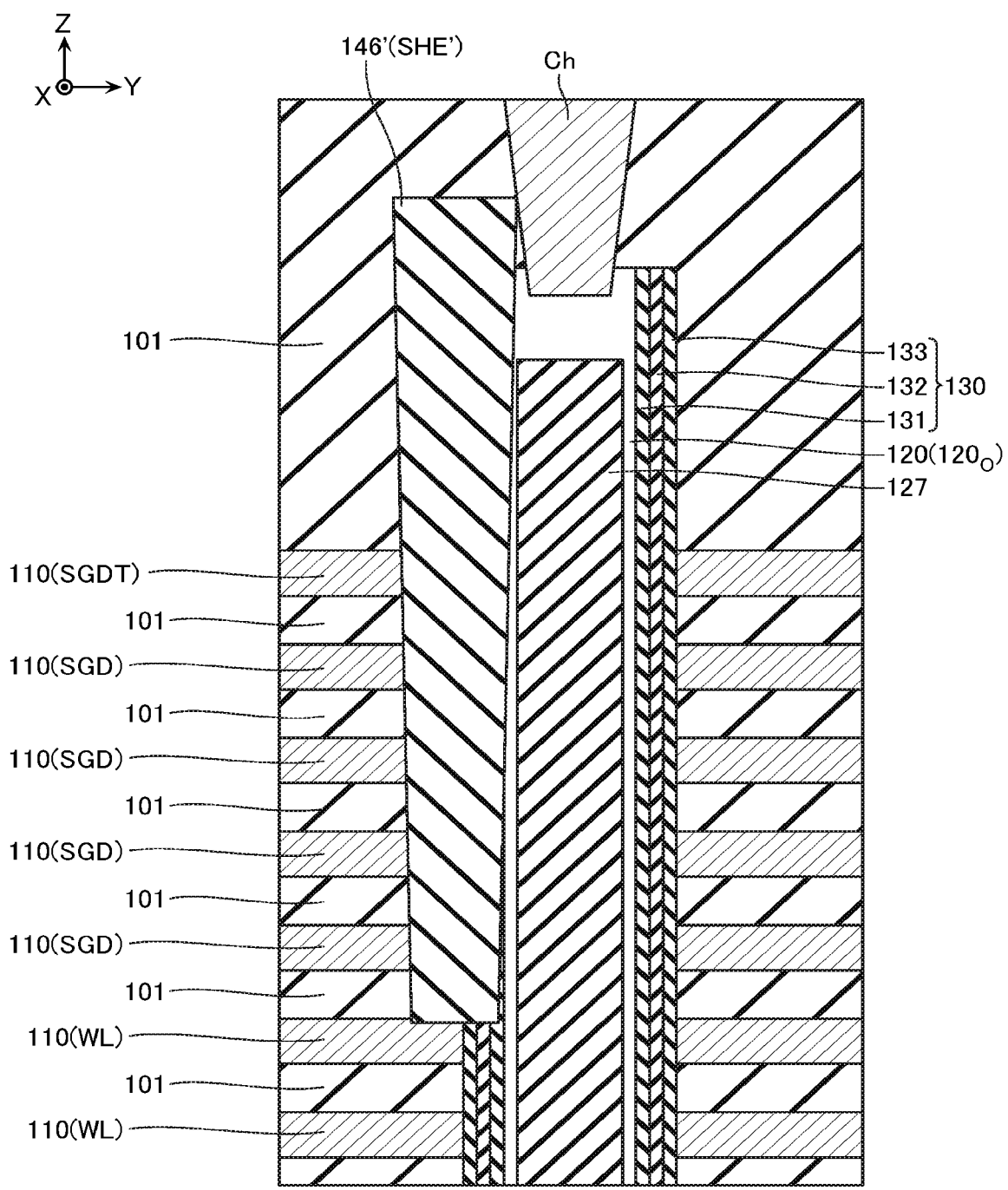
FIG. 13 is a schematic cross-sectional view illustrating a configuration of a part of the semiconductor memory device according to the comparative example.

Next, with reference to FIG. 12 and FIG. 13, a configuration of a semiconductor memory device according to the comparative example will be described. FIG. 12 is a schematic plan view illustrating a configuration of a part of the semiconductor memory device according to the comparative example. FIG. 13 is a schematic cross-sectional view illustrating a configuration of a part of the semiconductor memory device according to the comparative example.

As illustrated in FIG. 12 and FIG. 13, the semiconductor memory device according to the comparative example includes an inter-string unit structure SHE' instead of the inter-string unit structure SHE. The inter-string unit structure SHE' is configured of an insulating layer 146' of, for example, silicon oxide ($SiO_2$). The inter-string unit structure SHE' does not include the conductive layer 145 (FIG. 6 to FIG. 8).

Figure 14:
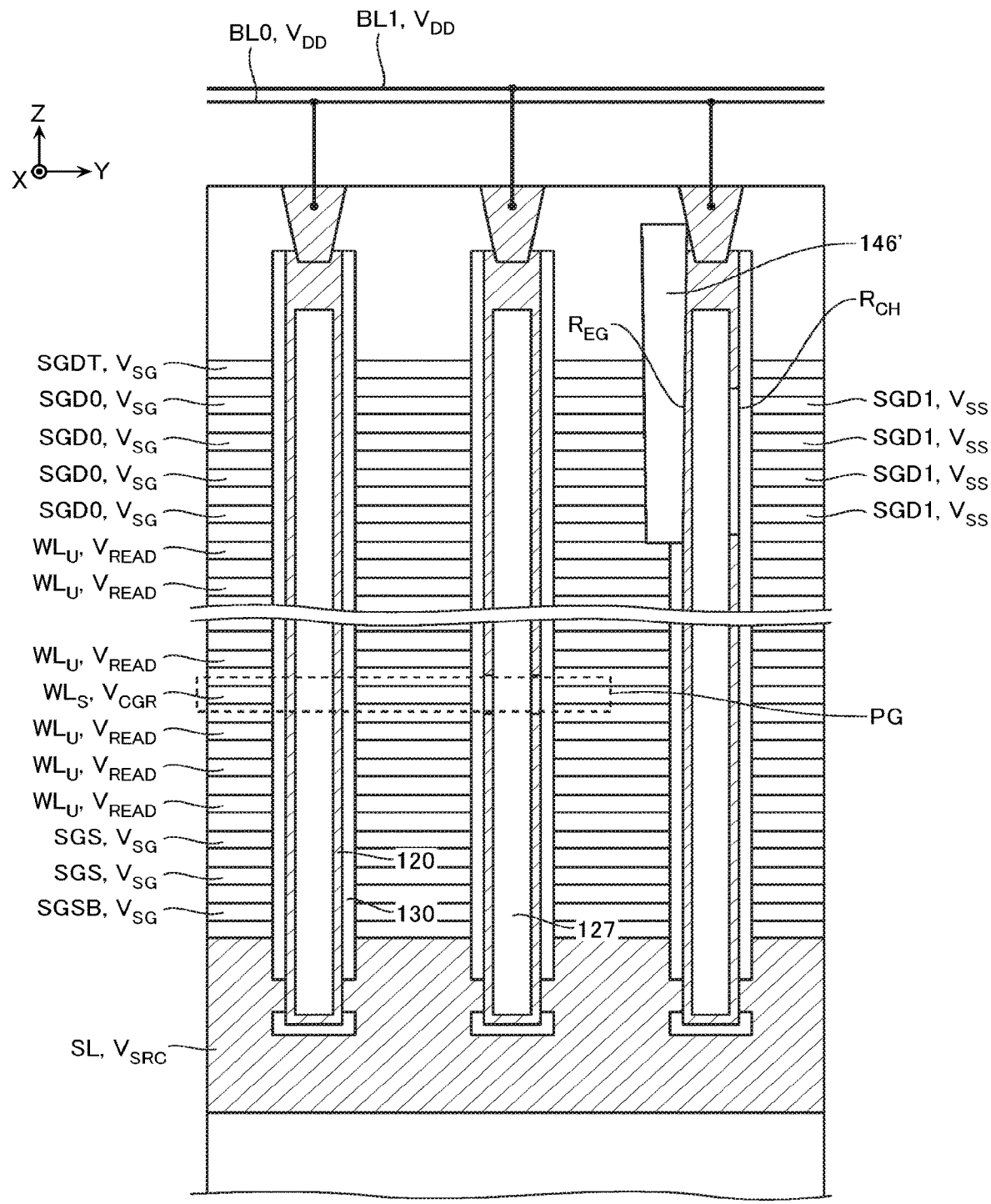
FIG. 14 is a schematic cross-sectional view for describing a read operation of the semiconductor memory device according to the comparative example.

Next, with reference to FIG. 14, a read operation of the semiconductor memory device according to the comparative example will be described. FIG. 14 is a schematic cross-sectional view for describing the read operation of the semiconductor memory device according to the comparative example.

As described above, the semiconductor memory device according to the comparative example does not include the conductive layer 145 (FIG. 6 to FIG. 8). Here, in the semiconductor memory device according to the comparative example, there is a case where the electron channels are formed in the regions $R_{EG}$ on the outer peripheral surfaces of the plurality of semiconductor columns $120_o$ corresponding to the drain-side select gate line SGD1 when the drain-side select gate line SGD0 is applied with the voltage $V_{SG}$. In such a case, regardless of data stored in the selected memory cell MC, the current may flow to the bit lines BL0, BL1 and the read operation possibly fails to be preferably executed.

Figure 15:
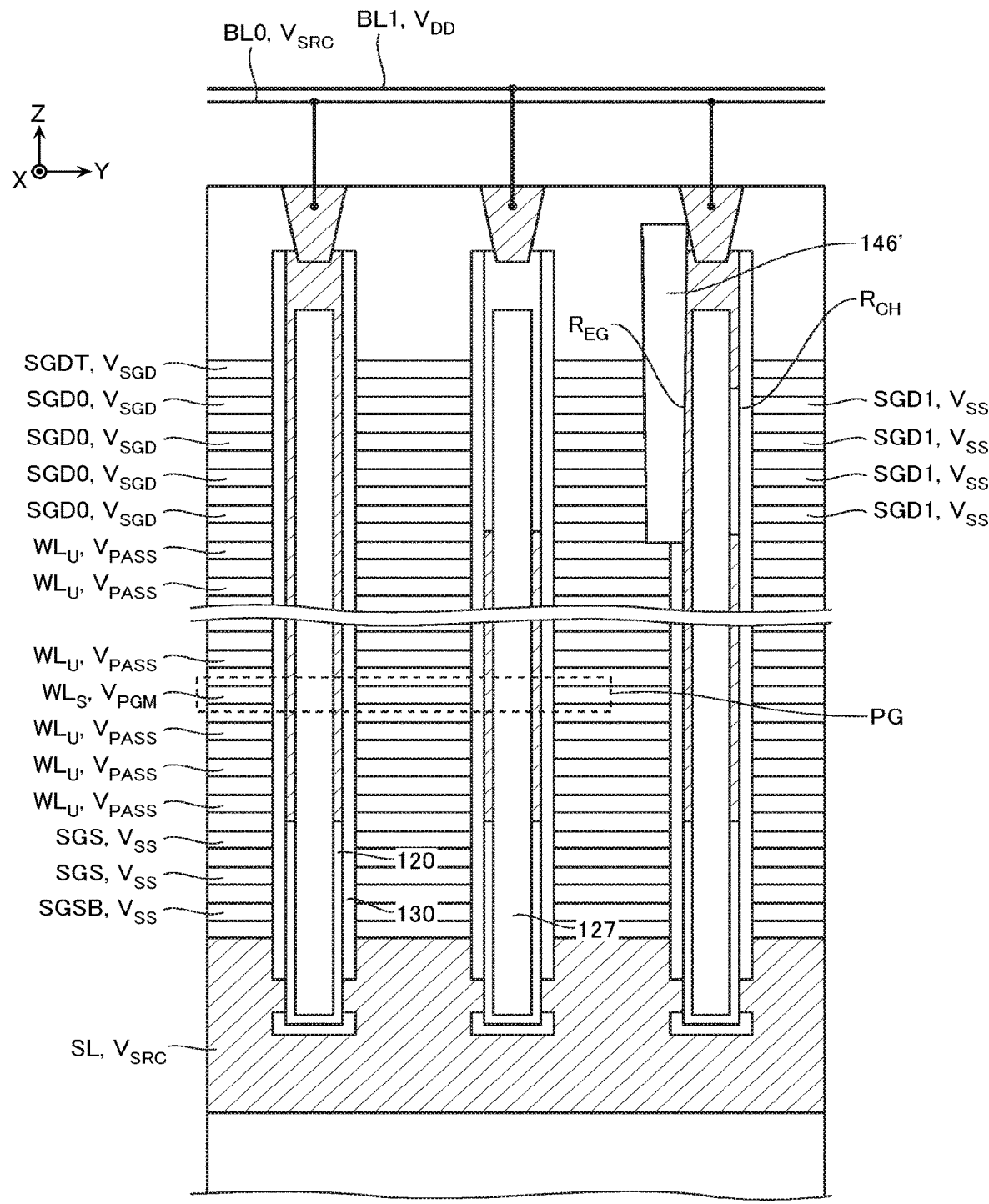
FIG. 15 is a schematic cross-sectional view for describing a write operation of the semiconductor memory device according to the comparative example.

Next, with reference to FIG. 15, a write operation of the semiconductor memory device according to the comparative example will be described. FIG. 15 is a schematic cross-sectional view for describing the write operation of the semiconductor memory device according to the comparative example.

As described above, the semiconductor memory device according to the comparative example does not include the conductive layer 145 (FIG. 6 to FIG. 8). Here, in the semiconductor memory device according to the comparative example, there is a case where the electron channels are formed in the region $R_{EG}$ on the outer peripheral surfaces of the plurality of semiconductor columns $120_o$ corresponding to the drain-side select gate line SGD1 when the drain-side select gate line SGD0 is applied with the voltage $V_{SGD}$. In such a case, not only the memory cell MC as a write operation target, but also the threshold voltage of other memory cells MC connected to the bit line BL0 and the selected word line $WL_S$ in common with this memory cell MC is possibly increased.

[Effect]

As described with reference to FIG. 6 to FIG. 8, the semiconductor memory device according to the first embodiment includes the conductive layer 145. Upon the read operation and the write operation, the conductive layer 145 is applied with a voltage smaller than the voltages $V_{SG}$, $V_{SGD}$ applied to the drain-side select gate line SGD corresponding to the string unit SU as an operation target. With such a configuration, for example, as described with reference to FIG. 9 and FIG. 10, it is possible to prevent an unintended drain-side select transistor STD from being turned into ON state. Accordingly, the read operation and the write operation are preferably executable.

Second Embodiment

Figure 16:
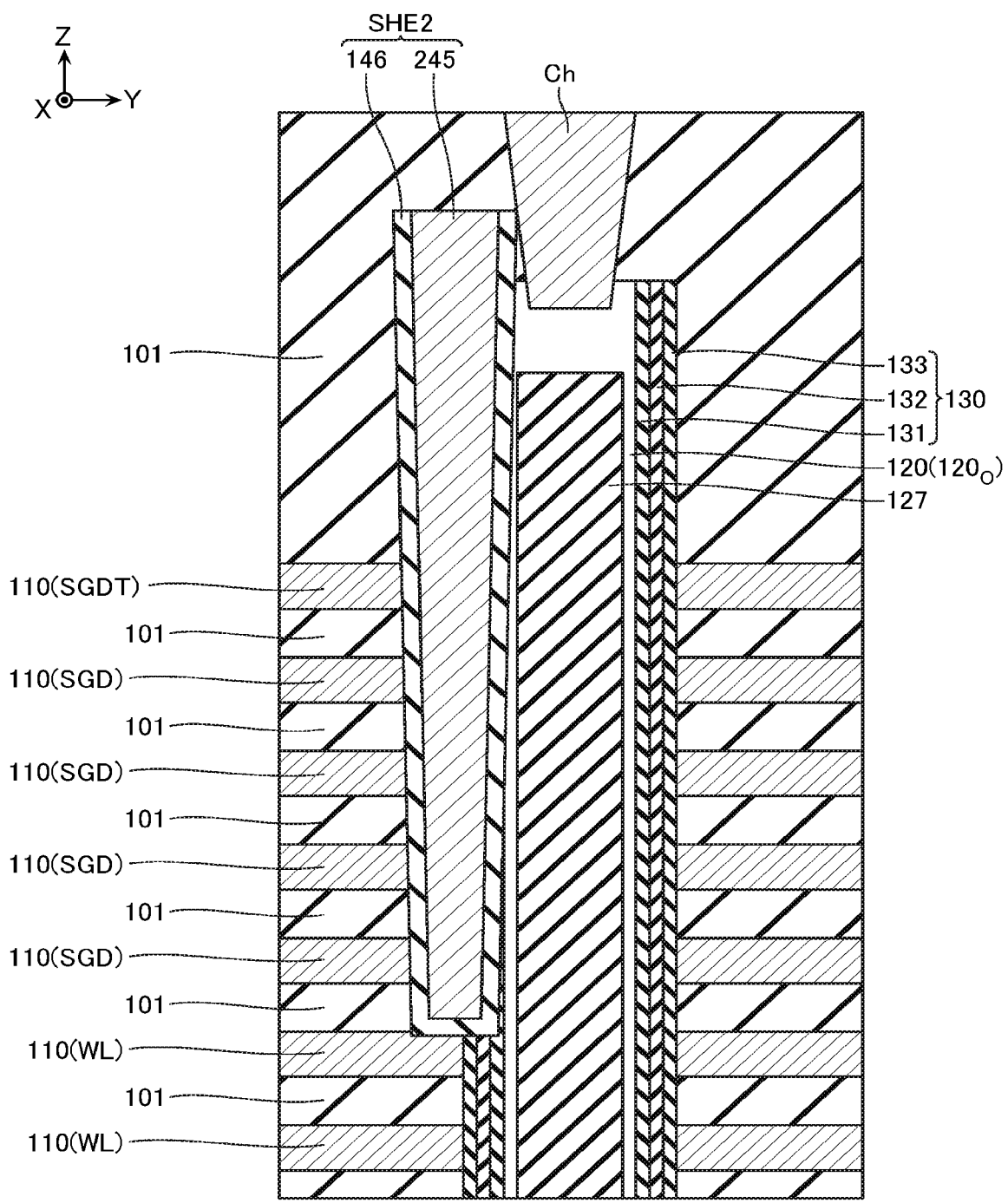
FIG. 16 is a schematic cross-sectional view illustrating a configuration of a part of a semiconductor memory device according to a second embodiment.

Next, with reference to FIG. 16, an exemplary configuration of a semiconductor memory device according to a second embodiment will be described. FIG. 16 is a schematic cross-sectional view illustrating a configuration of a part of the semiconductor memory device.

The semiconductor memory device according to the second embodiment is basically configured similarly to the semiconductor memory device according to the first embodiment. However, the semiconductor memory device according to the second embodiment includes an inter-string unit structure SHE2 instead of the inter-string unit structure SHE.

The inter-string unit structure SHE2 is basically configured similarly to the inter-string unit structure SHE. However, the inter-string unit structure SHE2 includes a conductive layer 245 instead of the conductive layer 145.

The conductive layer 245 is basically configured similarly to the conductive layer 145. However, the conductive layer 245 is not connected to the contact $C_{SHE}$ (FIG. 8). The conductive layer 245 is not electrically connected to the peripheral circuit PC (FIG. 1). The conductive layer 245 is an electric charge accumulating layer in floating state.

Next, an operation of the semiconductor memory device according to the second embodiment will be described.

A read operation and a write operation of the semiconductor memory device according to the second embodiment are basically executed similarly to the read operation and the write operation of the semiconductor memory device according to the first embodiment. However, the conductive layer 245 according to the second embodiment is not connected to the peripheral circuit PC, and therefore, the conductive layer 245 is applied with no voltage. In the semiconductor memory device according to the second embodiment, a certain number or more of the electrons are preliminarily accumulated in the conductive layer 245. This can prevent the unintended drain-side select transistor STD from being turned into ON state similarly to the semiconductor memory device according to the first embodiment.

The semiconductor memory device according to the second embodiment is configured to be able to perform an operation to accumulate the electrons in the conductive layer 245. Such an operation is hereinafter referred to as a SHE write operation in some cases.

Figure 17:
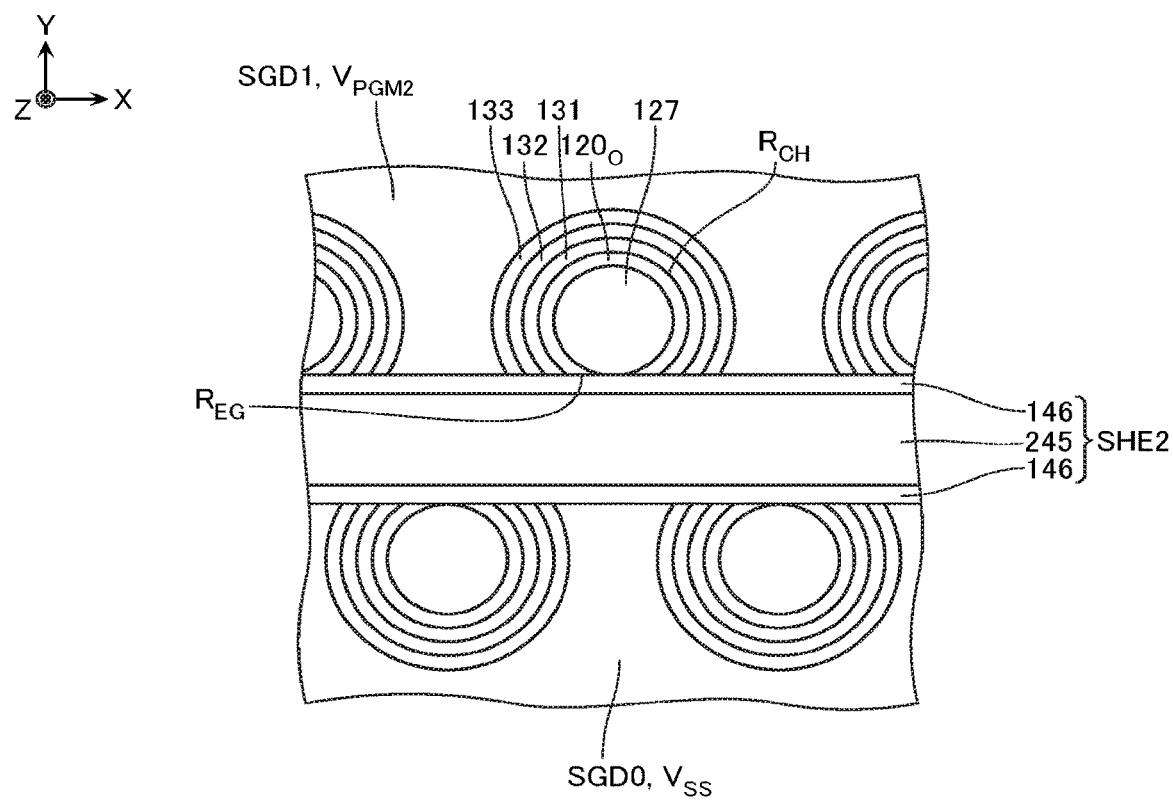
FIG. 17 is a schematic plan view for describing a SHE write operation of the semiconductor memory device according to the second embodiment.
Figure 18:
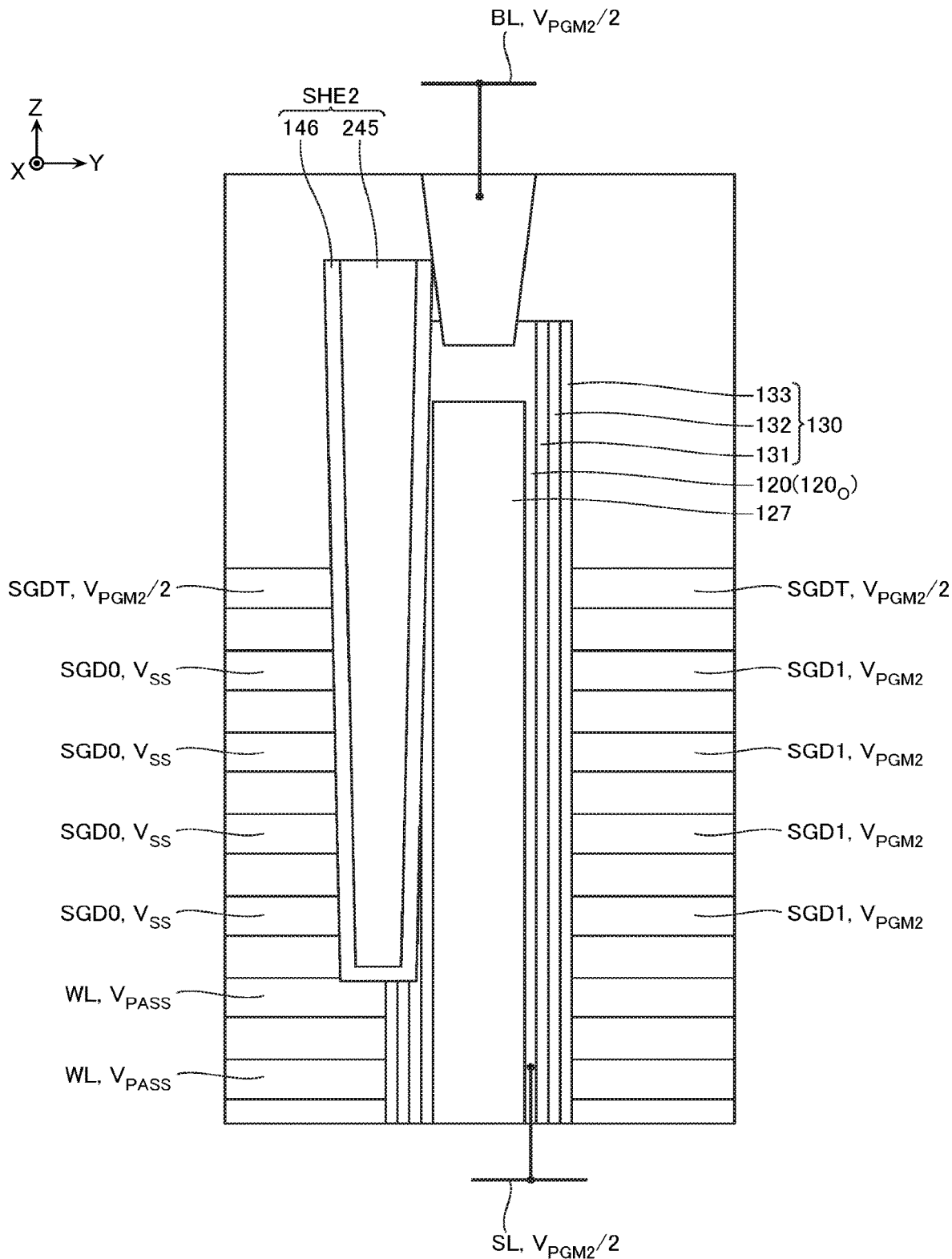
FIG. 18 is a schematic cross-sectional view for describing the SHE write operation of the semiconductor memory device according to the second embodiment.

Next, with reference to FIG. 17 and FIG. 18, one example of the SHE write operation will be described. FIG. 17 is a schematic plan view for describing the SHE write operation. FIG. 18 is a schematic cross-sectional view for describing the SHE write operation.

In the example in FIG. 18, the drain-side select gate line SGD0 is applied with the ground voltage $V_{SS}$ and the drain-side select gate line SGD1 is applied with a voltage $V_{PGM2}$. The voltage $V_{PGM2}$ is larger than the ground voltage $V_{SS}$. The voltage $V_{PGM2}$ is larger than the voltage $V_{SG}$ described with reference to FIG. 9. This increases the voltage of the conductive layer 245 up to approximately a voltage $V_{PGM2}/2$, which is half the voltage $V_{PGM2}$, by capacitive coupling with the drain-side select gate lines SGD0, SGD1. The electrons in the drain-side select gate line SGD0 tunnels into the conductive layer 245 via the insulating layer 146.

Note that, in the example in FIG. 18, the plurality of word lines WL is applied with the write pass voltage $V_{PASS}$. The bit line BL and the source line SL are applied with the voltage $V_{PGM2}/2$. This allows to reduce variations in threshold voltage of the drain-side select transistor STD by relaxing an electric field between the channel region and the gate electrode of the drain-side select transistor STD.

In the example in FIG. 18, the drain-side select gate line SGDT is applied with the voltage $V_{PGM2}/2$. This allows to reduce variations in threshold voltage of the drain-side select transistor STDT by relaxing the electric field between the channel region and the gate electrode of the drain-side select transistor STDT. The voltage difference between the drain-side select gate line SGDT and the drain-side select gate lines SGD0, SGD1 can be relaxed.

Figure 19:
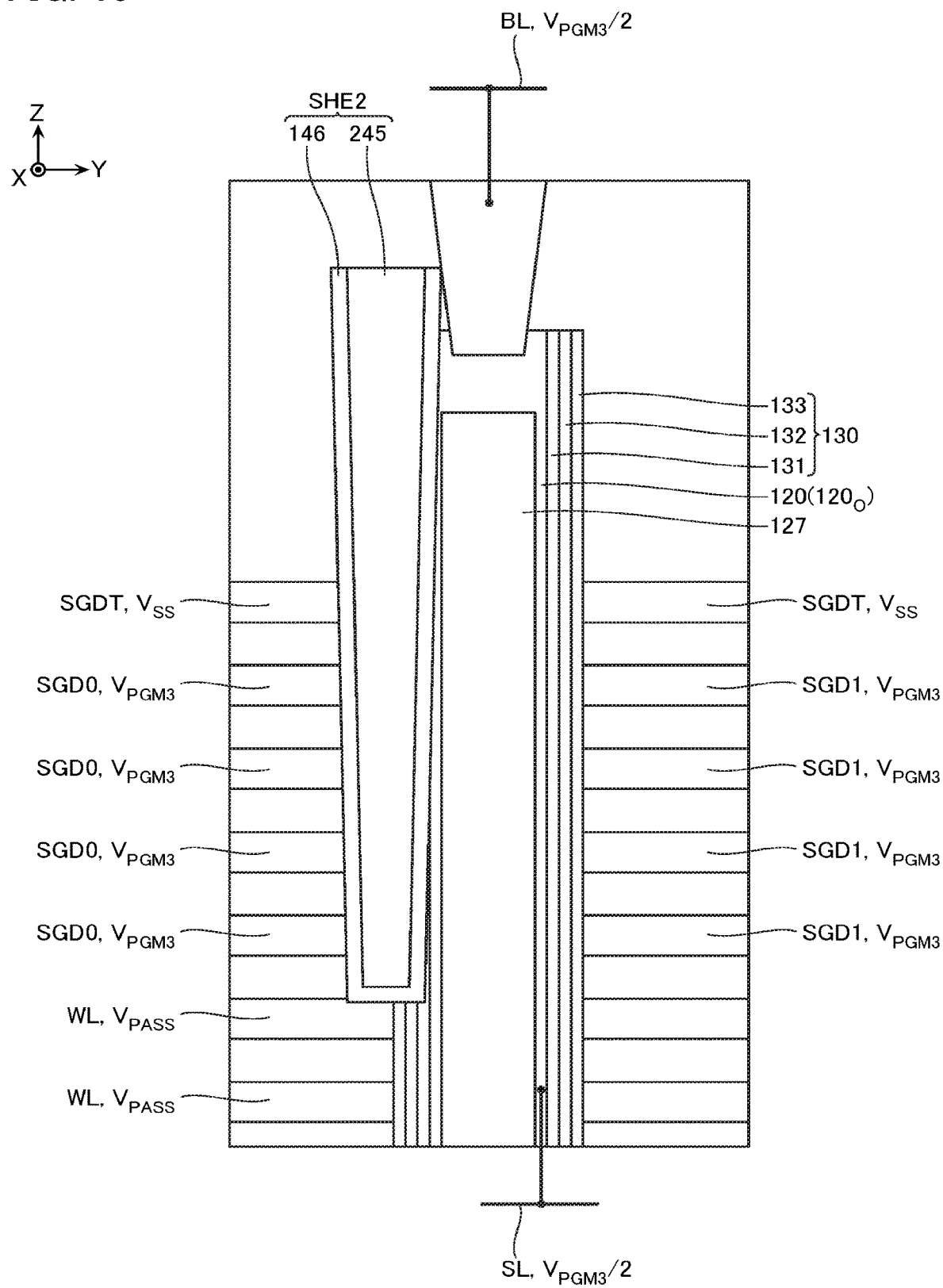
FIG. 19 is a schematic cross-sectional view for describing another SHE write operation of the semiconductor memory device according to the second embodiment.

Next, with reference to FIG. 19, another example of the SHE write operation will be described. FIG. 19 is a schematic cross-sectional view for describing the SHE write operation.

In the example in FIG. 19, the plurality of drain-side select gate lines SGD0 are applied with a voltage $V_{PGM3}$. The plurality of drain-side select gate lines SGD1 are applied with the voltage $V_{PGM3}$. The voltage $V_{PGM3}$ is larger than the ground voltage V. This increases the voltage of the conductive layer 245 up to approximately the voltage $V_{PGM3}$ by capacitive coupling of the drain-side select gate lines SGD0, SGD1.

In the example in FIG. 19, the plurality of drain-side select gate lines SGDT are applied with the ground voltage $V_{SS}$. This causes the electrons in the drain-side select gate line SGDT to tunnel into the conductive layer 245 via the insulating layer 146.

Note that, in the example in FIG. 19, the plurality of word lines WL are applied with the write pass voltage $V_{PASS}$. The bit line BL and the source line SL are applied with a voltage $V_{PGM3}/2$. This allows to reduce variations in threshold voltage of the drain-side select transistor STD by relaxing the electric field between the channel region and the gate electrode of the drain-side select transistor STD.

Here, a timing when the SHE write operation as described with reference to FIG. 17 and FIG. 18 or FIG. 19 is executed is adjustable as necessary. For example, the SHE write operation may be executed only at a timing before shipping after production of the semiconductor memory device. The SHE write operation may be executed at a timing after shipping the semiconductor memory device. In such a case, the SHE write operation may, for example, be executed every time when the erase operation is executed for the predetermined number of times on a certain memory block BLK.

[Effect]

In the second embodiment, the conductive layer 245 in the inter-string unit structure SHE2 functions as an electric charge accumulating layer. In such a configuration, unlike the semiconductor memory device according to the first embodiment, the contact $C_{SHE}$ (FIG. 8) is not necessary. Accordingly, the semiconductor memory device according to the second embodiment is achievable at a lower cost than the semiconductor memory device according to the first embodiment by omitting a manufacturing process of the contact $C_{SHE}$ (FIG. 8) in some cases.

The semiconductor memory device according to the second embodiment can execute not only the SHE write operation as described with reference to FIG. 17 and FIG. 18 but the SHE write operation as described with reference to FIG. 19.

Here, as described above, in the SHE write operation as described with reference to FIG. 17 and FIG. 18, the ground voltage $V_{SS}$ is applied to the drain-side select gate line SGD0 and the voltage $V_{PGM2}$ is applied to the drain-side select gate line SGD1. This increases the voltage of the conductive layer 245 up to approximately the voltage $V_{PGM2}/2$, which is half the voltage $V_{PGM2}$, by capacitive coupling with the drain-side select gate lines SGD0, SGD1. In such a case, the voltage difference between the drain-side select gate line SGD0 and the conductive layer 245 is as large as the voltage $V_{PGM2}/2$. Therefore, in the SHE write operation as described with reference to FIG. 17 and FIG. 18, the magnitude of the voltage $V_{PGM2}$ is adjusted such that the electrons tunnel between the drain-side select gate line SGD0 and the conductive layer 245 at the voltage $V_{PGM2}/2$.

As described above, in the SHE write operation as described with reference to FIG. 19, the plurality of drain-side select gate lines SGD0 are applied with the voltage $V_{PGM3}$. The plurality of drain-side select gate line SGD1 are applied with the voltage $V_{PGM3}$. The plurality of drain-side select gate line SGDT are applied with the ground voltage $V_{SS}$. This increases the voltage of the conductive layer 245 up to the voltage $V_{PGM3}$ by capacitive coupling with the drain-side select gate lines SGD0, SGD1. For example, in the example in FIG. 19, the number of the conductive layers 110 (SGD) and the number of the conductive layers 110 (SGDT) are 4:1. Accordingly, the voltage of the conductive layer 245 increases up to approximately a voltage $4V_{PGM3}/5$. In such a case, the voltage difference between the drain-side select gate line SGDT and the conductive layer 245 has a magnitude approximately the same as the voltage $4V_{PGM3}/5$. Accordingly, in the SHE write operation as described with reference to FIG. 19, the magnitude of the voltage $V_{PGM3}$ may be adjusted such that the electrons tunnel between the drain-side select gate line SGD0 and the conductive layer 245 at the voltage $4V_{PGM3}/5$.

Thus, for example, when the SHE write operation as described with reference to FIG. 19 is employed, the voltage used in the SHE write operation can be decreased compared with the case where the SHE write operation as described with reference to FIG. 17 and FIG. 18 is employed. For example, in the example in FIG. 17 to FIG. 19, the magnitude of the voltage $V_{PGM3}$ can be approximately ⅝ of the magnitude of the voltage $V_{PGM2}$.

Third Embodiment

Figure 20:
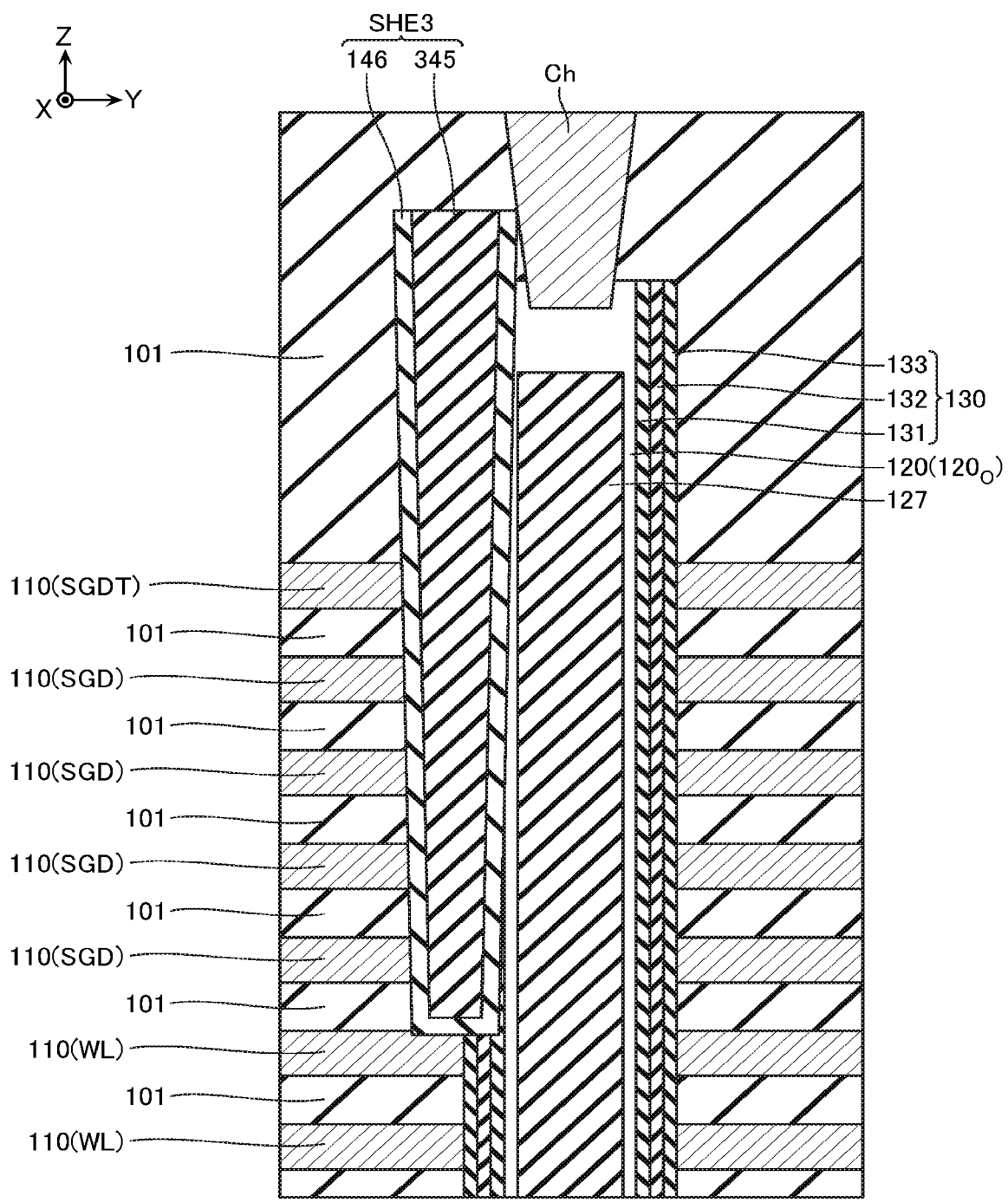
FIG. 20 is a schematic cross-sectional view illustrating a configuration of a part of a semiconductor memory device according to a third embodiment.

Next, with reference to FIG. 20, an exemplary configuration of a semiconductor memory device according to a third embodiment will be described. FIG. 20 is a schematic cross-sectional view illustrating a configuration of a part of the semiconductor memory device.

The semiconductor memory device according to the third embodiment is basically configured similarly to the semiconductor memory device according to the second embodiment. However, the semiconductor memory device according to the third embodiment includes an inter-string unit structure SHE3 instead of the inter-string unit structure SHE2.

The inter-string unit structure SHE3 is basically configured similarly to the inter-string unit structure SHE2. However, the inter-string unit structure SHE3 includes an electric charge accumulating layer 345 instead of the conductive layer 245.

The electric charge accumulating layer 345 is basically configured similarly to the conductive layer 245. However, the electric charge accumulating layer 345 includes an insulating material. For example, the electric charge accumulating layer 345 includes silicon nitride (SiN) and the like.

Next, an operation of the semiconductor memory device according to the third embodiment will be described.

A read operation and a write operation of the semiconductor memory device according to the third embodiment is executed similarly to the read operation and the write operation of the semiconductor memory device according to the second embodiment.

The semiconductor memory device according to the third embodiment is configured to be able to perform the SHE write operation similarly to the semiconductor memory device according to the second embodiment.

For example, the semiconductor memory device according to the third embodiment may be configured to be able to perform the SHE write operation as described with reference to FIG. 17 and FIG. 18.

Figure 21:
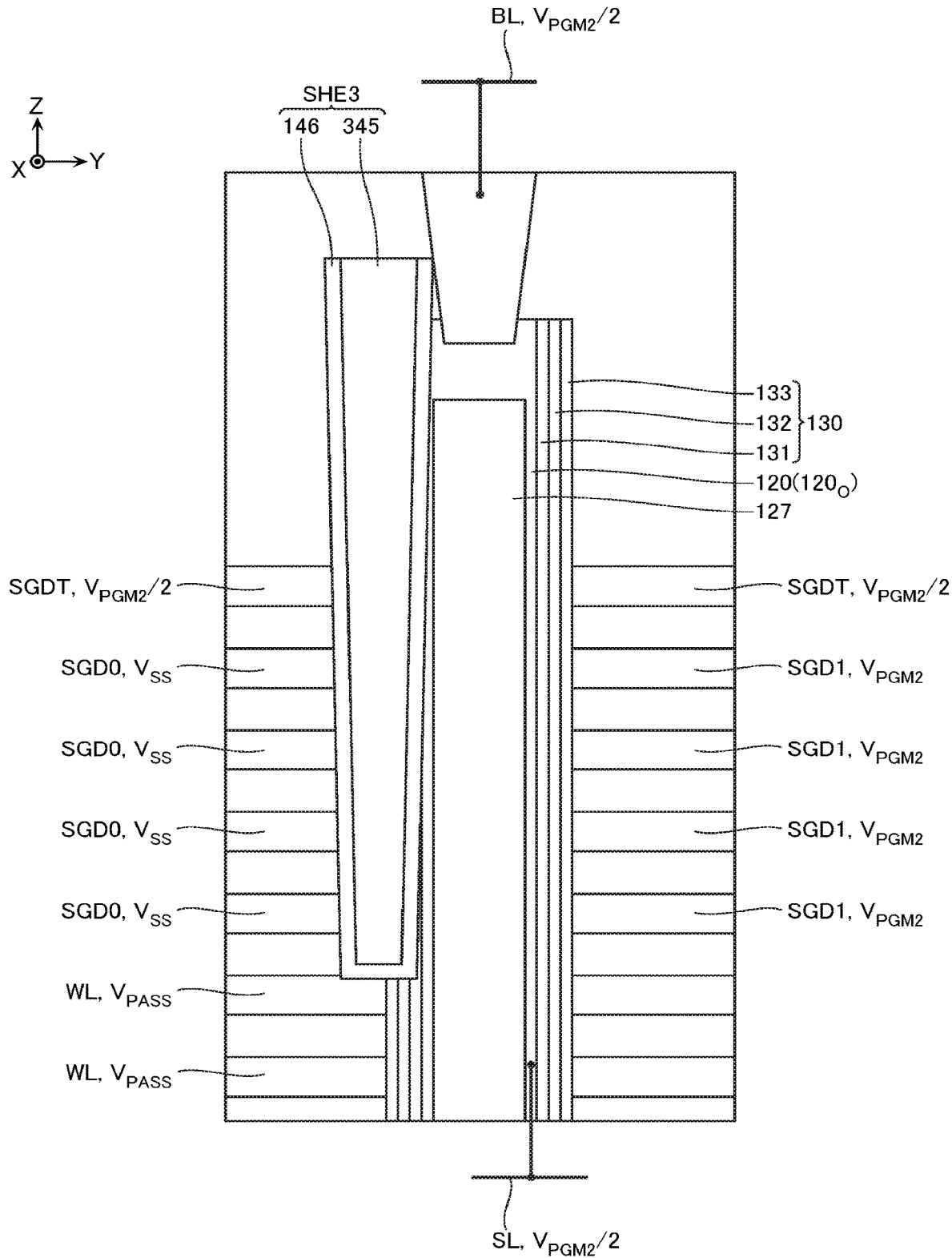
FIG. 21 is a schematic cross-sectional view for describing a SHE write operation of the semiconductor memory device according to the third embodiment.
Figure 22:
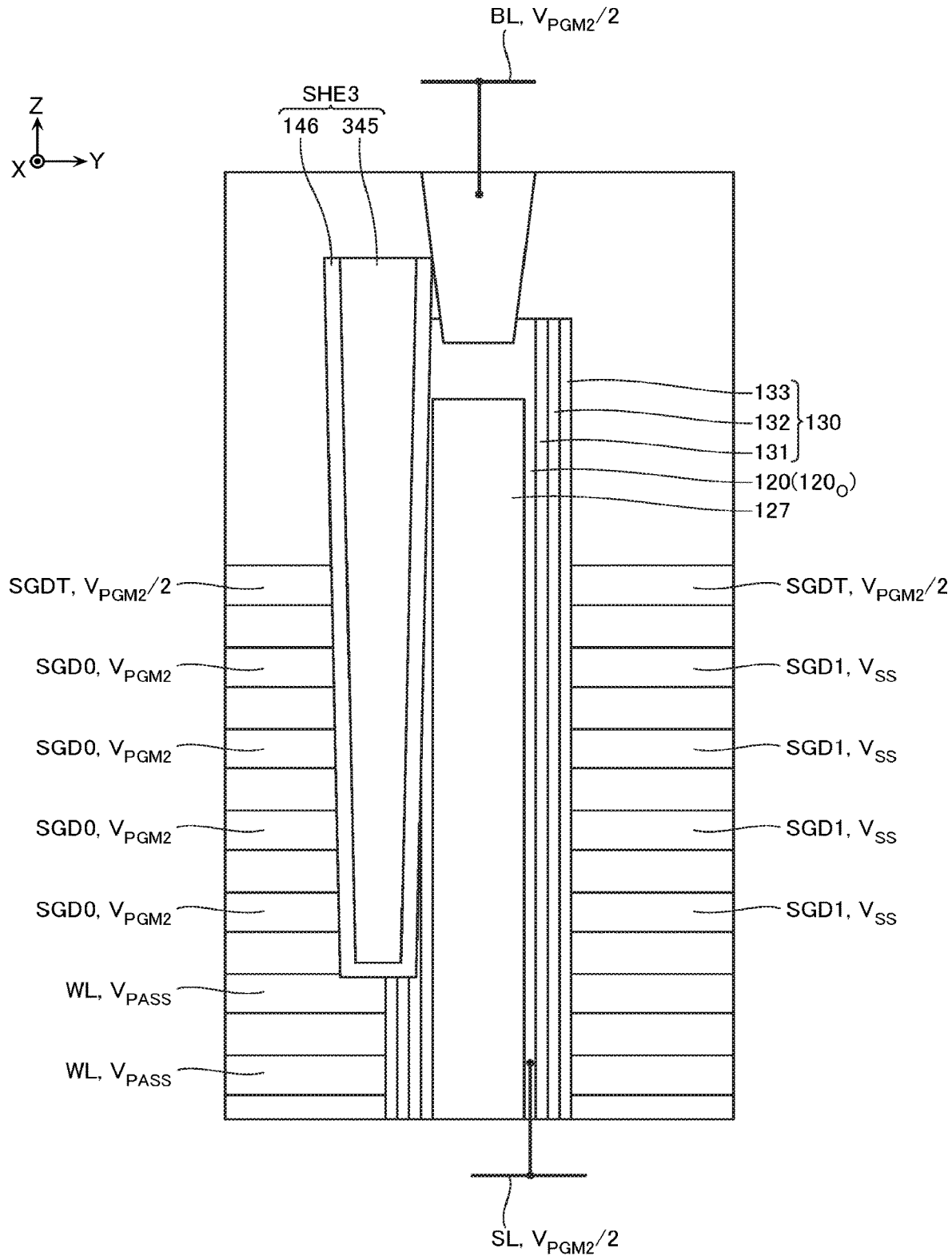
FIG. 22 is a schematic cross-sectional view for describing the SHE write operation of the semiconductor memory device according to the third embodiment.

Next, with reference to FIG. 21 and FIG. 22, another example of the SHE write operation will be described. FIG. 21 and FIG. 22 are schematic cross-sectional views for describing the SHE write operation.

In the examples in FIG. 21 and FIG. 22, first, as illustrated in FIG. 21, the drain-side select gate line SGD0 is applied with the ground voltage $V_{SS}$ and the drain-side select gate line SGD1 is applied with the voltage $V_{PGM2}$. This causes the electrons in the drain-side select gate line SGD0 to tunnel into the electric charge accumulating layer 345 via the insulating layer 146.

Next, as illustrated in FIG. 22, the drain-side select gate line SGD1 is applied with the ground voltage $V_{SS}$ and the drain-side select gate line SGD0 is applied with the voltage $V_{PGM2}$. This causes the electrons in the drain-side select gate line SGD1 to tunnel into the electric charge accumulating layer 345 via the insulating layer 146.

Note that, in the example in FIG. 21 and FIG. 22, the plurality of word lines WL are applied with the write pass voltage $V_{PASS}$. The bit line BL and the source line SL are applied with the voltage $V_{PGM2}/2$. This allows to reduce variations in threshold voltage of the drain-side select transistor STD by relaxing the electric field between the channel region and the gate electrode of the drain-side select transistor STD.

In the example in FIG. 21 and FIG. 22, the drain-side select gate line SGDT is applied with the voltage $V_{PGM2}/2$. This allows to reduce variations in threshold voltage of the drain-side select transistor STDT by relaxing the electric field between the channel region and the gate electrode of the drain-side select transistor STDT. The voltage difference between the drain-side select gate line SGDT and the drain-side select gate lines SGD0, SGD1 can be relaxed.

[Effect]

The inter-string unit structure SHE3 according to the third embodiment includes the insulating electric charge accumulating layer 345. In such a configuration, unlike the semiconductor memory device according to the first embodiment, the contact $C_{SHE}$ (FIG. 8) is not necessary. Accordingly, the semiconductor memory device according to the third embodiment is achievable at a lower cost than the semiconductor memory device according to the first embodiment in some cases.

As described with reference to FIG. 16, the inter-string unit structure SHE2 according to the second embodiment includes the conductive layer 245 functioning as an electric charge accumulating layer. In such a configuration, for example, when the position of the contact Ch is displaced when the contact Ch is manufactured, the contact Ch is brought into contact with the conductive layer 245 to possibly cause a short-circuit.

Meanwhile, as described with reference to FIG. 20, the inter-string unit structure SHE3 according to the third embodiment includes the insulating electric charge accumulating layer 345. In such a configuration, a problem, such as a short-circuit, is not caused, for example, even when the contact Ch is brought into contact with the insulating electric charge accumulating layer 345. Accordingly, the semiconductor memory device according to the third embodiment is manufacturable with a good yield compared with the semiconductor memory device according to the second embodiment.

The semiconductor memory device according to the third embodiment can execute not only the SHE write operation as described with reference to FIG. 17 and FIG. 18 but also the SHE write operation as described with reference to FIG. 21 and FIG. 22.

Here, as described above, the inter-string unit structure SHE3 according to the third embodiment includes the insulating electric charge accumulating layer 345. In such a configuration, when the SHE write operation as described with reference to FIG. 17 and FIG. 18 is executed, the electrons are locally charged only in a region in vicinity of a side surface at one side of the electric charge accumulating layer 345 in the Y-direction (in the example in FIG. 17 and FIG. 18, a side of the drain-side select gate line SGD0) in some cases. In such a case, upon the read operation and the write operation, unintended electron channels are possibly formed based on the voltage applied to the drain-side select gate line SGD0 in the regions $R_{EG}$ on the outer peripheral surfaces of the semiconductor columns $120_o$ opposed to the side surface at the other side of the electric charge accumulating layer 345 in the Y-direction (in the example in FIG. 17 and FIG. 18, at a side of the drain-side select gate line SGD1).

Therefore, in the SHE write operation as described with reference to FIG. 21 and FIG. 22, first, as illustrated in FIG. 21, the drain-side select gate line SGD0 is applied with the ground voltage $V_{SS}$ and the drain-side select gate line SGD1 is applied with the voltage $V_{PGM2}$. This causes the electrons in the drain-side select gate line SGD0 to tunnel into a region near the side surface at one side in the Y-direction (the drain-side select gate line SGD0 side) in the electric charge accumulating layer 345 via the insulating layer 146.

In the SHE write operation as described with reference to FIG. 21 and FIG. 22, next, as illustrated in FIG. 22, the drain-side select gate line SGD1 is applied with the ground voltage $V_{SS}$ and the drain-side select gate line SGD0 is applied with the voltage $V_{PGM2}$. This causes the electrons in the drain-side select gate line SGD1 to tunnel into a region near the side surface at the other side in the Y-direction (the drain-side select gate line SGD1 side) in the electric charge accumulating layer 345 via the insulating layer 146.

With such a method, upon the read operation and the write operation, it is possible to preferably prevent the unintended electron channel from being formed in the drain-side select transistor STD corresponding to the string unit SU at the one side, which is not an operation target, among the regions $R_{EG}$ on the outer peripheral surfaces of the respective semiconductor columns $120_o$ opposed to both side surfaces of the electric charge accumulating layer 345 in the Y-direction.

Fourth Embodiment

Figure 23:
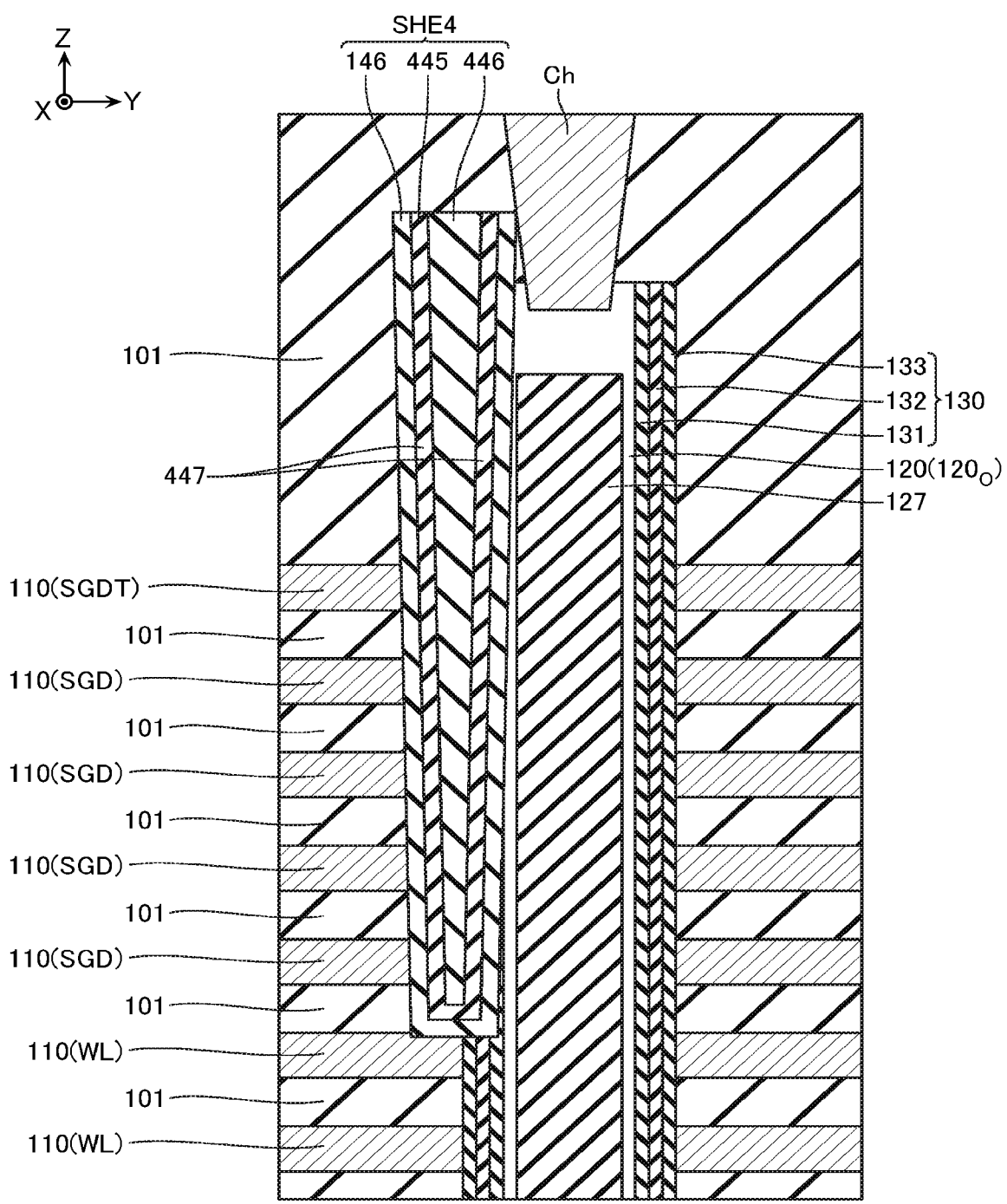
FIG. 23 is a schematic cross-sectional view illustrating a configuration of a part of a semiconductor memory device according to a fourth embodiment.

Next, with reference to FIG. 23, an exemplary configuration of a semiconductor memory device according to a fourth embodiment will be described. FIG. 23 is a schematic cross-sectional view illustrating a configuration of a part of the semiconductor memory device.

The semiconductor memory device according to the fourth embodiment is basically configured similarly to the semiconductor memory device according to the third embodiment. However, the semiconductor memory device according to the fourth embodiment includes an inter-string unit structure SHE4 instead of the inter-string unit structure SHE3.

The inter-string unit structure SHE4 is basically configured similarly to the inter-string unit structure SHE3. However, the inter-string unit structure SHE4 includes an electric charge accumulating layer 445 and an insulating layer 446 of, for example, silicon oxide ($SiO_2$), instead of the electric charge accumulating layer 345.

The insulating layer 446 has a lower end positioned above the upper surface of the conductive layer 110 (WL) positioned at the uppermost layer. The lower end of the insulating layer 446 is positioned below the lower surface of the conductive layer 110 (SGD) positioned at the lowermost layer. The insulating layer 446 has an upper end positioned above the upper surface of the conductive layer 110 positioned at the uppermost layer.

The electric charge accumulating layer 445 is basically configured similarly to the electric charge accumulating layer 345. However, the electric charge accumulating layer 445 has two portions 447 across the insulating layer 446. These two portions 447 each extend in the X-direction and the Z-direction between the insulating layer 446 and the insulating layer 146. Lower ends of these two portions 447 extending in the Z-direction are connected to one another.

Next, an operation of the semiconductor memory device according to the fourth embodiment will be described.

A read operation and a write operation of the semiconductor memory device according to the fourth embodiment are executed similarly to the read operation and the write operation of the semiconductor memory device according to the third embodiment.

A SHE write operation of the semiconductor memory device according to the fourth embodiment is executed similarly to the SHE write operation of the semiconductor memory device according to the third embodiment.

[Effect]

The inter-string unit structure SHE4 according to the fourth embodiment includes the insulating electric charge accumulating layer 445. In such a configuration, unlike the semiconductor memory device according to the first embodiment, the contact $C_{SHE}$ (FIG. 8) is not necessary. Accordingly, it is achievable at a lower cost than the semiconductor memory device according to the first embodiment in some cases.

The inter-string unit structure SHE4 according to the fourth embodiment includes the insulating electric charge accumulating layer 445. Accordingly, the semiconductor memory device according to the fourth embodiment is manufacturable with a good yield compared with the semiconductor memory device according to the second embodiment in some cases.

For example, dielectric constant of silicon oxide ($SiO_2$) is smaller than dielectric constant of silicon nitride (SiN). Accordingly, for example, when the electric charge accumulating layer 345 of the inter-string unit structure SHE3 (FIG. 20) according to the third embodiment is configured of silicon nitride (SiN), electrostatic capacity between the semiconductor column $120_o$ and the conductive layer 110 (SGD) opposed to the semiconductor column $120_o$ via the inter-string unit structure SHE3 is relatively increased in some cases. Here, for example, in the case where the electric charge accumulating layer 445 is configured of silicon nitride (SiN) and the insulating layer 446 is configured of silicon oxide ($SiO_2$) like the inter-string unit structure SHE4 (FIG. 23) according to the fourth embodiment, the electrostatic capacity between the semiconductor column $120_o$ and the conductive layer 110 (SGD) opposed to the semiconductor column $120_o$ via the inter-string unit structure SHE4 can be reduced.

The inter-string unit structure SHE4 according to the fourth embodiment includes the electric charge accumulating layer 445 and the insulating layer 446. The electric charge accumulating layer 445 includes the two portions 447 extending in the Z-direction. In such a configuration, compared with the electric charge accumulating layer 345 according to the third embodiment, a diffusion range of the electrons is reduced. Accordingly, the distribution of the electrons in the electric charge accumulating layer 445 is preferably maintained and reliability of the read operation and the write operation can be improved.

Fifth Embodiment

Figure 24:
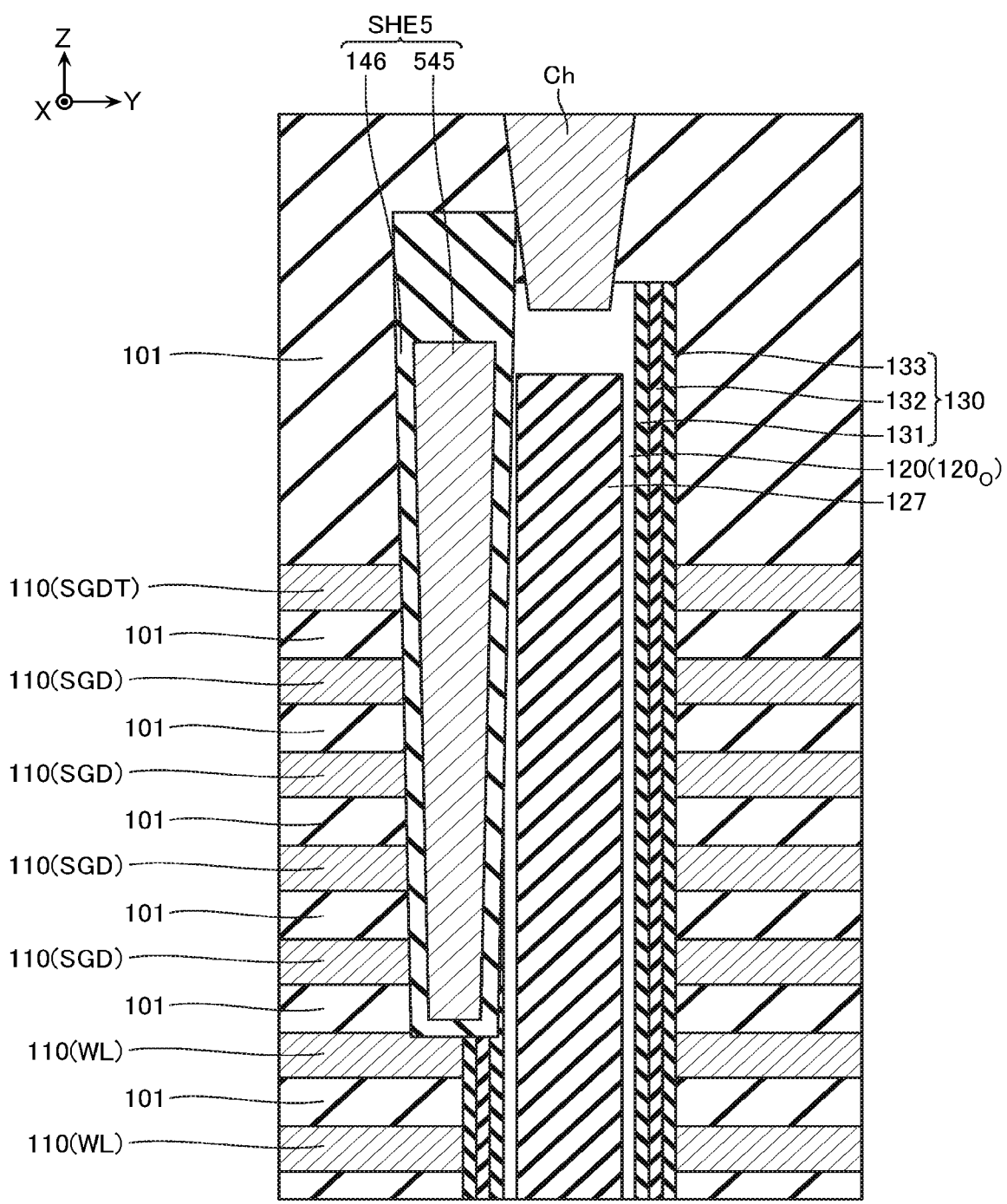
FIG. 24 is a schematic cross-sectional view illustrating a configuration of a part of a semiconductor memory device according to a fifth embodiment.

Next, with reference to FIG. 24, an exemplary configuration of a semiconductor memory device according to a fifth embodiment will be described. FIG. 24 is a schematic cross-sectional view illustrating a configuration of a part of the semiconductor memory device.

The semiconductor memory device according to the fifth embodiment is basically configured similarly to the semiconductor memory device according to the first embodiment. However, the semiconductor memory device according to the fifth embodiment includes an inter-string unit structure SHE5 instead of the inter-string unit structure SHE.

The inter-string unit structure SHE5 is basically configured similarly to the inter-string unit structure SHE. However, the inter-string unit structure SHE5 includes a conductive layer 545 instead of the conductive layer 145.

The conductive layer 545 is basically configured similarly to the conductive layer 145. However, the upper end of the conductive layer 145 is positioned above the upper end of the semiconductor column 120. On the other hand, the conductive layer 545 has an upper end positioned below the upper end of the semiconductor column 120. Note that the upper end of the conductive layer 545 is positioned above the upper surface of the conductive layer 110 positioned at the uppermost layer.

[Effect]

As described with reference to FIG. 7, in the first embodiment, the upper end of the conductive layer 145 is positioned above the upper end of the semiconductor column 120. In such a configuration, for example, when the position of the contact Ch is displaced upon manufacturing the contact Ch, the contact Ch is brought into contact with the conductive layer 145 to possibly cause a short-circuit.

On the other hand, as described with reference to FIG. 24, in the fifth embodiment, the upper end of the conductive layer 545 is positioned below the upper end of the semiconductor column 120. In such a configuration, for example, even when the position of the contact Ch is displaced upon manufacturing the contact Ch, the contact between the contact Ch and the conductive layer 545 can be suppressed. Accordingly, the semiconductor memory device according to the fifth embodiment is manufacturable with a good yield compared with the semiconductor memory device according to the first embodiment in some cases.

Sixth Embodiment

Figure 25:
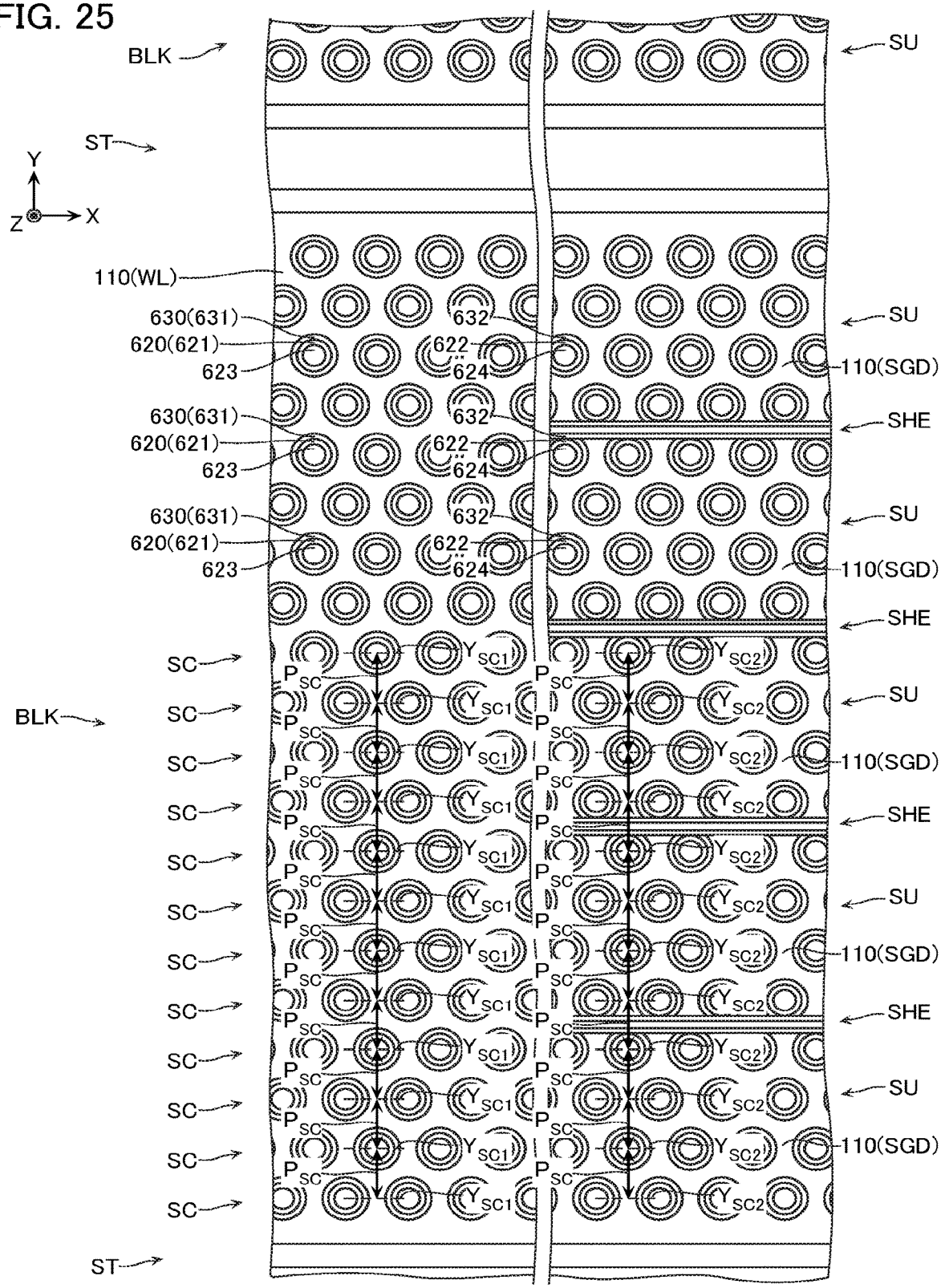
FIG. 25 is a schematic cross-sectional view illustrating a configuration of a part of a semiconductor memory device according to a sixth embodiment.
Figure 26:
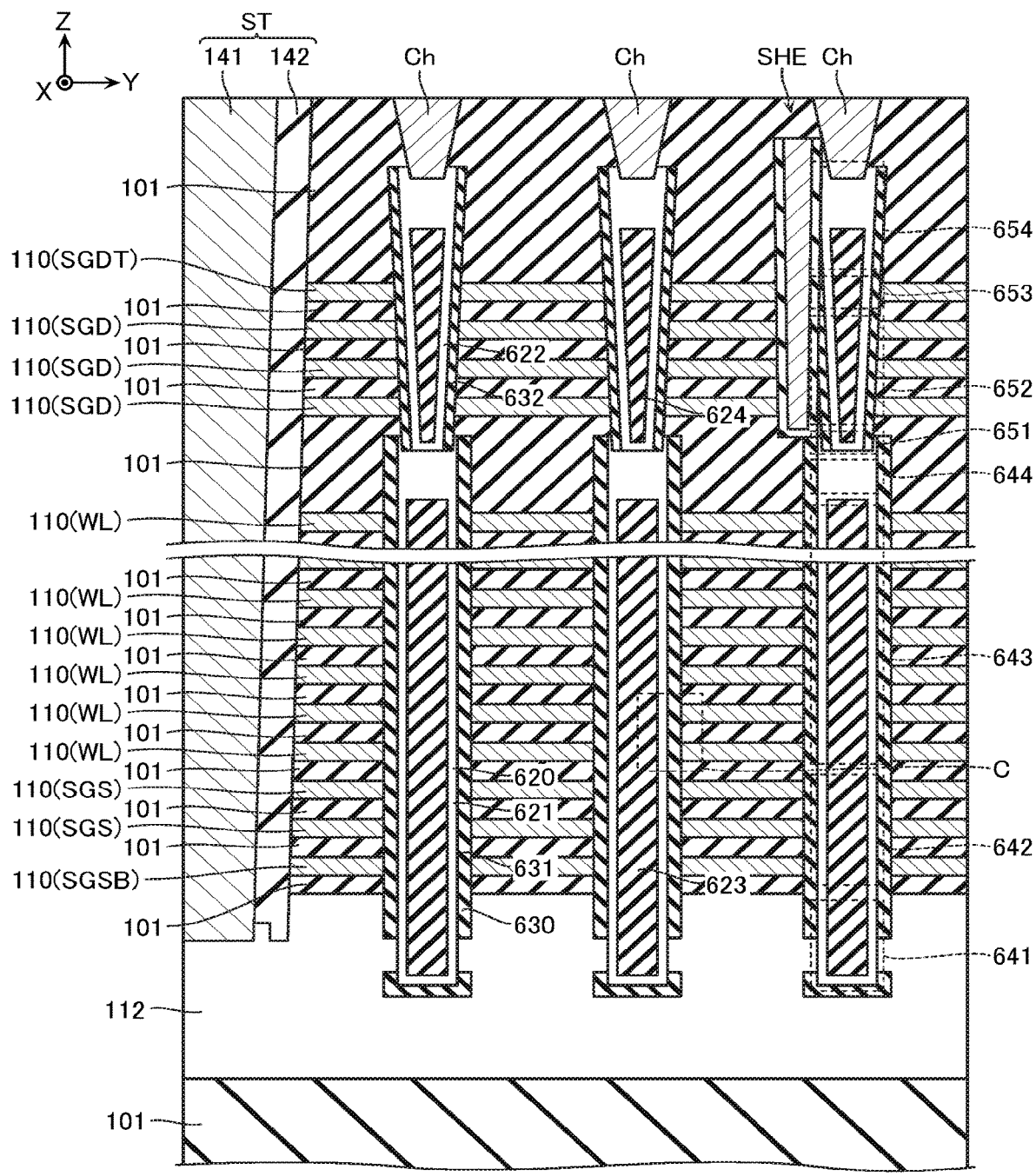
FIG. 26 is a schematic cross-sectional view illustrating a configuration of a part of the semiconductor memory device according to the sixth embodiment.

Next, with reference to FIG. 25 and FIG. 26, an exemplary configuration of a semiconductor memory device according to a sixth embodiment will be described. FIG. 25 and FIG. 26 are schematic cross-sectional views illustrating a configuration of a part of the semiconductor memory device. Note that FIG. 25 illustrates an XY cross-section corresponding to the conductive layer 110 (WL) and an XY cross-section corresponding to the conductive layer 110 (SGD).

The semiconductor memory device according to the sixth embodiment is basically configured similarly to the semiconductor memory device according to the first embodiment. However, the semiconductor memory device according to the sixth embodiment includes a semiconductor column 620 and a gate insulating film 630 instead of the semiconductor column 120 and the gate insulating film 130.

The semiconductor column 620 have, for example, as illustrated in FIG. 26, a portion 621 and a portion 622. The portions 621, 622 include, for example, polycrystalline silicon (Si). The portions 621, 622 have an approximately cylindrical shape and have a center portion where insulating layers 623, 624 of, for example, silicon oxide ($SiO_2$), are disposed.

The portion 621 has a region 641 disposed at a lower end, a region 642 opposed to the one or a plurality of conductive layers 110 (SGSB) and the one or a plurality of conductive layers 110 (SGS), a region 643 opposed to the plurality of conductive layers 110 (WL), and a region 644 disposed at an upper end. The region 641 to the region 643 are configured similarly to the region 121 to the region 123 described with reference to FIG. 4. The region 644 covers an upper surface of the insulating layer 623.

The portion 622 includes a region 651 disposed at a lower end, a region 652 opposed to the one or a plurality of conductive layers 110 (SGD), a region 653 opposed to the one or a plurality of conductive layers 110 (SGDT), and a region 654 disposed at an upper end. The region 651 is connected to the region 644. The region 651 has lengths in the X-direction and the Y-direction that may be smaller than lengths of the region 644 in the X-direction and the Y-direction. The regions 652, 653, 654 are configured similarly to the regions 124, 125, 126 described with reference to FIG. 4.

Here, as illustrated in FIG. 25, in the sixth embodiment, twenty semiconductor column rows SC are equally aligned in the Y-direction at the pitch $P_{SC}$ on an XY cross-section corresponding to the conductive layer 110 (WL). Also on an XY cross-section corresponding to the conductive layer 110 (SGD), twenty semiconductor column rows SC are equally aligned in the Y-direction at the pitch $P_{SC}$.

Note that FIG. 25 illustrates a center position of the semiconductor column row SC in the Y-direction in the XY cross-section corresponding to the conductive layer 110 (WL) as $Y_{SC1}$. A center position of the semiconductor column row SC in the Y-direction in the XY cross-section corresponding to the conductive layer 110 (SGD) is illustrated as $Y_{SC2}$.

The gate insulating film 630 includes, for example, as illustrated in FIG. 26, a portion 631 and a portion 632. The portion 631 is basically configured similarly to the gate insulating film 130 described with reference to FIG. 4 and FIG. 5. However, the portion 631 extends in the Z-direction along the outer peripheral surface of the portion 621 of the semiconductor column 620 excluding a part of region. For example, as illustrated in FIG. 26, the portion 631 is not disposed at a contact portion between the portion 621 and the conductive layer 112.

The portion 632 is basically configured similarly to the gate insulating film 130 described with reference to FIG. 4 and FIG. 5. The portion 632 extends in the Z-direction along the outer peripheral surface of the portion 622 of the semiconductor column 620 excluding a part of region. For example, as illustrated in FIG. 26, the portion 632 is not necessarily disposed at a contact portion between the portion 622 and the inter-string unit structure SHE.

Next, an operation of the semiconductor memory device according to the sixth embodiment will be described.

A read operation and a write operation of the semiconductor memory device according to the sixth embodiment is executed similarly to the read operation and the write operation of the semiconductor memory device according to the first embodiment.

Seventh Embodiment

Figure 27:
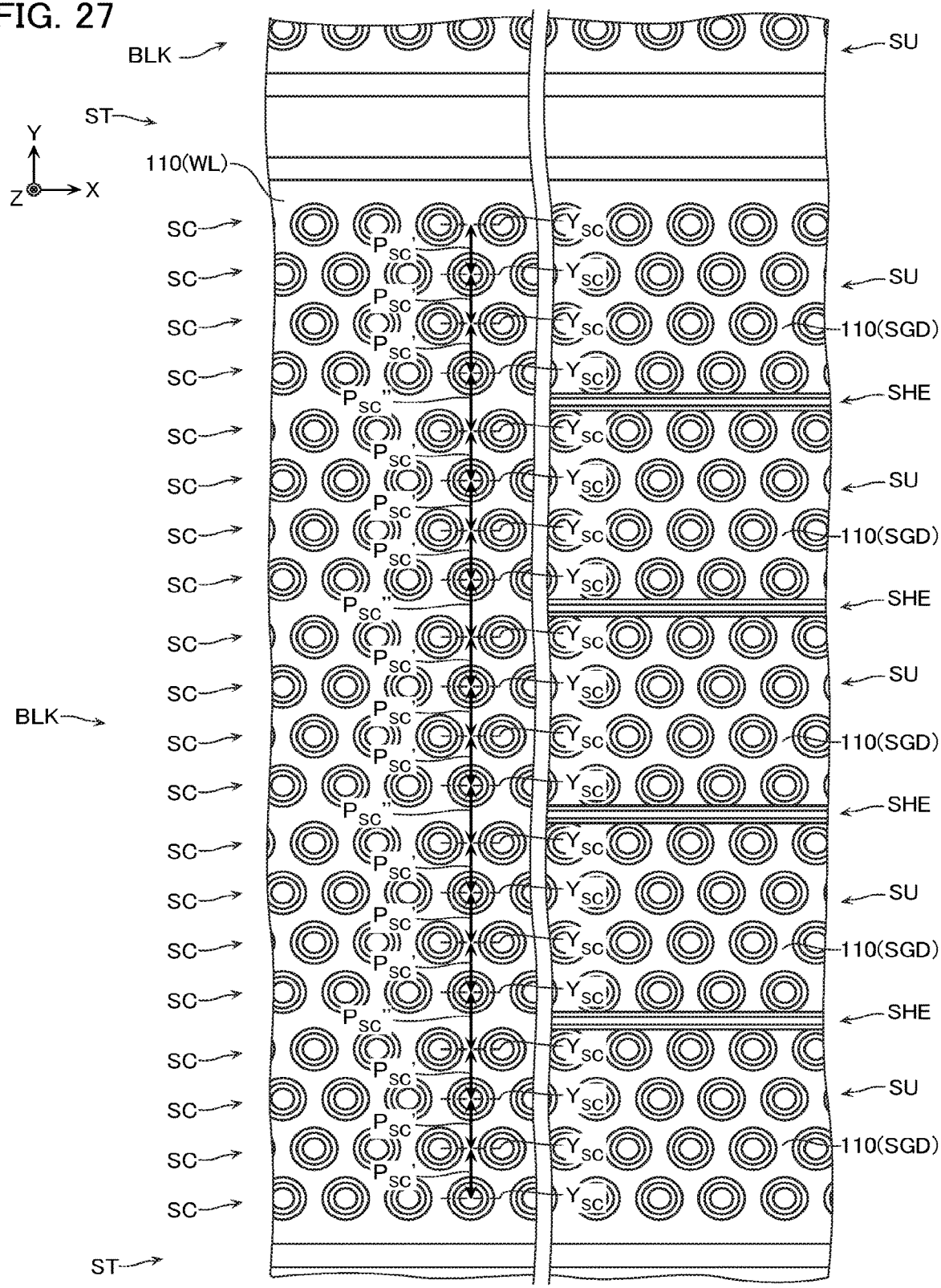
FIG. 27 is a schematic cross-sectional view illustrating a configuration of a part of a semiconductor memory device according to a seventh embodiment.

Next, with reference to FIG. 27, an exemplary configuration of a semiconductor memory device according to a seventh embodiment will be described. FIG. 27 is a schematic cross-sectional view illustrating a configuration of a part of the semiconductor memory device. Note that FIG. 27 illustrates an XY cross-section corresponding to the conductive layer 110 (WL) and an XY cross-section corresponding to the conductive layer 110 (SGD).

The semiconductor memory device according to the seventh embodiment is basically configured similarly to the semiconductor memory device according to the first embodiment. However, in the seventh embodiment, the semiconductor column 120 is disposed in a pattern different from that of the first embodiment.

For example, in the example in FIG. 27, the first to fourth semiconductor column rows SC counted from one side in the Y-direction (for example, a negative side in the Y-direction in FIG. 27) are aligned in the Y-direction at a pitch $P_{SC}'$. Similarly, the fifth to eighth, the ninth to twelfth, the thirteenth to sixteenth, and the seventeenth to twentieth semiconductor column rows SC counted from the one side in the Y-direction are also each aligned in the Y-direction at the pitch $P_{SC}'$.

In the example in FIG. 27, a distance in the Y-direction between the center position $Y_{SC}$ in the Y-direction of the 4n-th (n is an integer of one or more and four or less) semiconductor column row SC counted from the one side in the Y-direction and the center position $Y_{SC}$ in the Y-direction of the 4n+1-th semiconductor column row SC counted from the one side in the Y-direction is larger than the above-described pitch $P_{SC}'$. This distance is hereinafter referred to as a pitch $P_{SC}''$.

Here, as described with reference to FIG. 3 and FIG. 6, in the first embodiment, twenty semiconductor column rows SC are equally aligned in the Y-direction at the pitch $P_{SC}$. The length $Y_{SHE}$ (FIG. 6) of the conductive layer 145 in the Y-direction is smaller than this pitch $P_{SC}$ (FIG. 3).

On the other hand, in the seventh embodiment, twenty semiconductor column rows SC are aligned at two patterns of the pitches $P_{SC}'$, $P_{SC}''$ in the Y-direction. Thus, when there are a plurality of patterns of pitches of the semiconductor column rows SC, the length $Y_{SHE}$ (FIG. 6) of the conductive layer 145 in the Y-direction may be smaller than any of the pitches.

Note that the pitch $P_{SC}'$ can be defined by various kinds of methods. For example, an XY cross-section corresponding to the conductive layer 110 (WL) as exemplarily illustrated in FIG. 27 is observed by means, such as a SEM and a TEM, the center positions $Y_{SC}$ in the Y-direction of four semiconductor column rows SC corresponding to the focused string unit SU are measured on this XY cross-section, three distances between these four center positions $Y_{SC}$ are measured, and an average value or a medium value of these three distances may be used as the pitch $P_{SC}'$.

Eighth Embodiment

Figure 28:
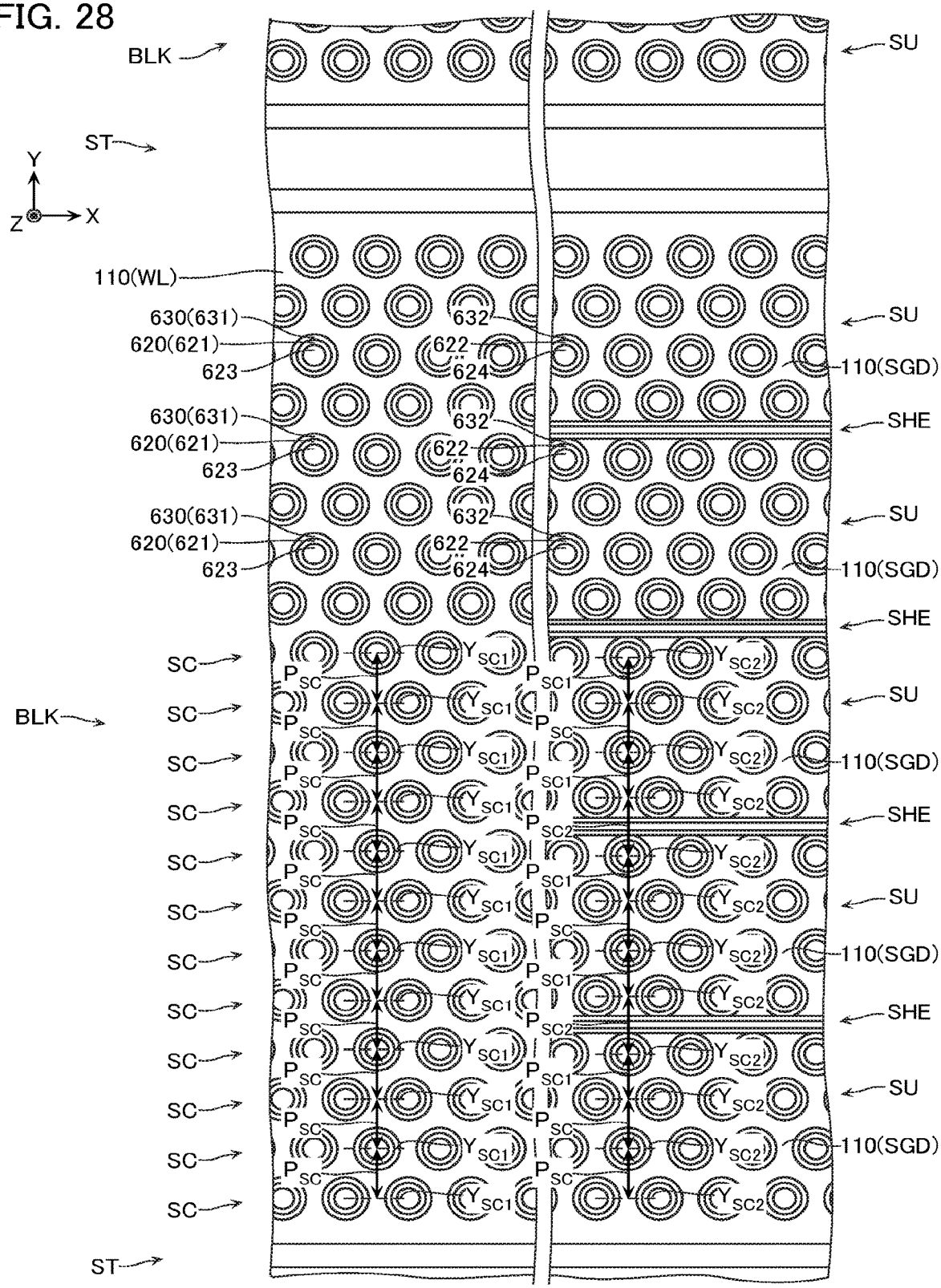
FIG. 28 is a schematic cross-sectional view illustrating a configuration of a part of a semiconductor memory device according to an eighth embodiment.
Figure 29:
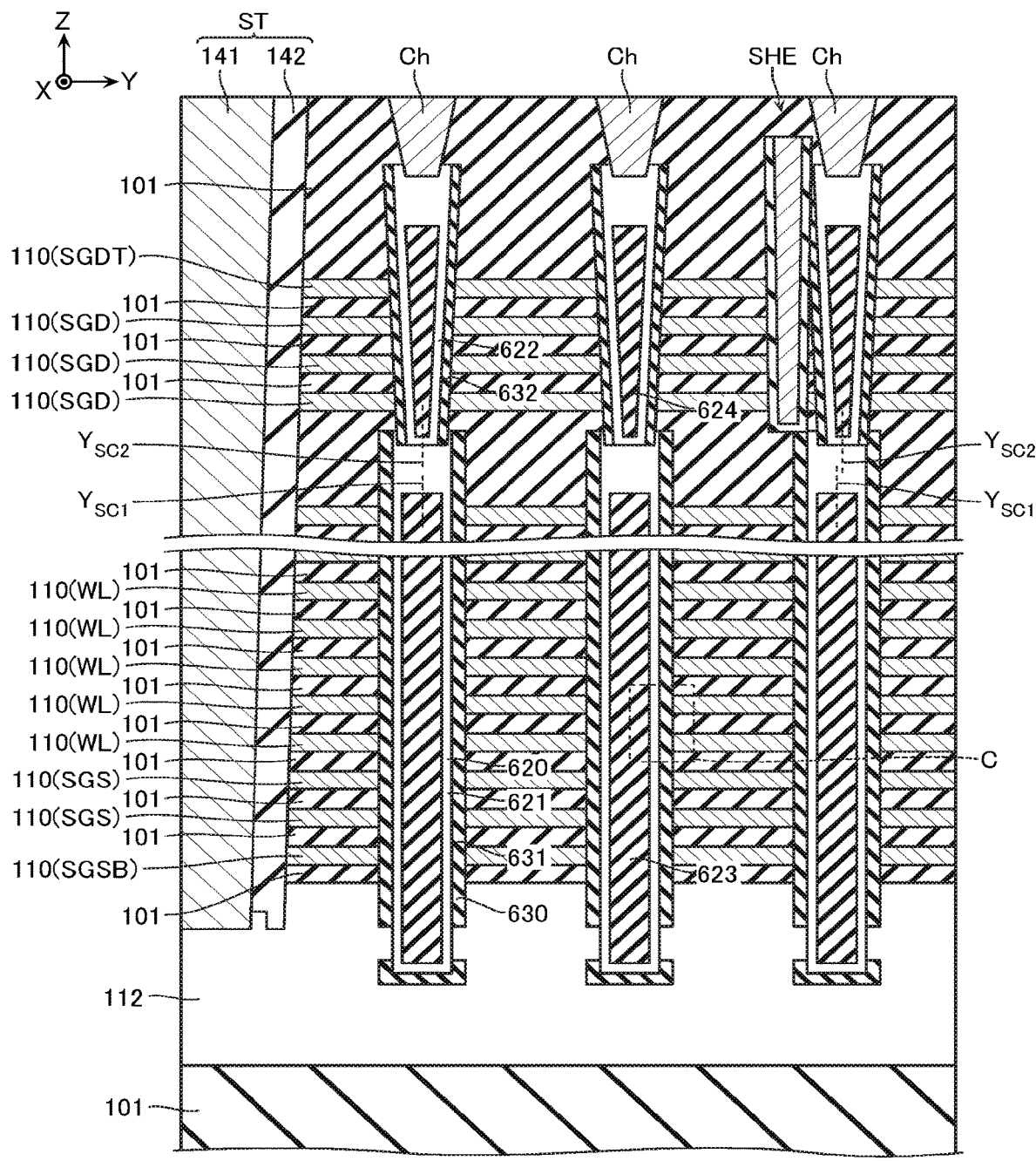
FIG. 29 is a schematic cross-sectional view illustrating a configuration of a part of the semiconductor memory device according to the eighth embodiment.

Next, with reference to FIG. 28 and FIG. 29, an exemplary configuration of a semiconductor memory device according to an eighth embodiment will be described. FIG. 28 and FIG. 29 are a schematic cross-sectional view illustrating a configuration of a part of the semiconductor memory device. Note that FIG. 28 illustrates an XY cross-section corresponding to the conductive layer 110 (WL) and an XY cross-section corresponding to the conductive layer 110 (SGD).

The semiconductor memory device according to the eighth embodiment is basically configured similarly to the semiconductor memory device according to the sixth embodiment. As illustrated in FIG. 28, in the XY cross-section according to the conductive layer 110 (WL), the semiconductor column 620 is disposed in a similar pattern to that in the sixth embodiment (see FIG. 25).

However, in the eighth embodiment, in the XY cross-section corresponding to the conductive layer 110 (SGD), the semiconductor column 620 is disposed in a different pattern from the sixth embodiment (see FIG. 25).

For example, in the example in FIG. 28, the first to third semiconductor column rows SC counted from one side in the Y-direction (for example, a negative side in the Y-direction in FIG. 28) are aligned in the Y-direction at the pitch $P_{SC}$. Similarly, the eighteenth to twentieth semiconductor column rows SC counted from the one side in the Y-direction are also each aligned in the Y-direction at the pitch $P_{SC}$.

In the example in FIG. 28, a distance in the Y-direction between the center position $Y_{SC2}$ in the Y-direction of a 4n−1-th (n is an integer of one or more and four or less) semiconductor column row SC counted from the one side in the Y-direction and the center position $Y_{SC2}$ in the Y-direction of a 4n-th semiconductor column row SC counted from the one side in the Y-direction is smaller than the above-described pitch $P_{SC}$. This distance is hereinafter referred to as a pitch $P_{SC1}$.

In the example in FIG. 28, a distance in the Y-direction between the center position $Y_{SC2}$ in the Y-direction of the 4n-th semiconductor column row SC counted from the one side in the Y-direction and the center position $Y_{SC2}$ in the Y-direction of the 4n+1-th semiconductor column row SC counted from the one side in the Y-direction is larger than the above-described pitch $P_{SC}$. This distance is hereinafter referred to as a pitch $P_{SC2}$.

In the example in FIG. 28, a distance in the Y-direction between the center position $Y_{SC2}$ in the Y-direction of the 4n+1-th semiconductor column row SC counted from the one side in the Y-direction and the center position $Y_{SC2}$ in the Y-direction of a 4n+2-th semiconductor column row SC counted from the one side in the Y-direction is smaller than the above-described pitch $P_{SC}$. This distance is equal to the above-described pitch $P_{SC1}$.

In the eighth embodiment, the XY cross-section corresponding to the conductive layer 110 (WL) and the XY cross-section corresponding to the conductive layer 110 (SGD) have the semiconductor columns 620 disposed in different patterns. In such a case, the length $Y_{SHE}$ (FIG. 6) of the conductive layer 145 in the Y-direction may be smaller than the pitch $P_{SC}$ of the semiconductor column row SC defined based on the XY cross-section corresponding to the conductive layer 110 (WL).

Note that, in the eighth embodiment, for example, as illustrated in FIG. 29, in at least one of the semiconductor columns 620, the center position (the center position $Y_{SC1}$) of the portion 621 in the Y-direction may correspond to the center position (the center position $Y_{SC2}$) of the portion 622 in the Y-direction. Such a semiconductor columns 620 may correspond to the first to third, 4n+2-th, 4n+3-th, and eighteenth to twentieth semiconductor column rows SC counted from the one side in the Y-direction (for example, the negative side in the Y-direction in FIG. 28).

In the eighth embodiment, for example, as illustrated in FIG. 29, in a plurality of the semiconductor columns 620, the center position (the center position $Y_{SC1}$) of the portion 621 in the Y-direction may be different from the center position (the center position $Y_{SC2}$) of the portion 622 in the Y-direction. Such a plurality of the semiconductor columns 620 may correspond to the 4n-th and 4n+1-th semiconductor column rows SC other than the twentieth semiconductor column row SC counted from the one side in the Y-direction (for example, the negative side in the Y-direction in FIG. 28).

Another Embodiment

The semiconductor memory devices according to the first embodiment to the eighth embodiment have been described above. However, such a configuration is merely an example and the specific configuration is appropriately adjustable.

For example, the upper end of the conductive layer 245 (FIG. 16) according to the second embodiment may be positioned above the upper end of the semiconductor column 120 similarly to the conductive layer 145 (FIG. 7) according to the first embodiment or may be positioned below the upper end of the semiconductor column 120 similarly to the conductive layer 545 (FIG. 24) according to the fifth embodiment. When the upper end of the conductive layer 245 is positioned below the upper end of the semiconductor column 120, similarly to the semiconductor memory device according to the fifth embodiment, the contact between the contact Ch and the conductive layer 545 can be suppressed.

For example, the semiconductor memory devices according to the sixth embodiment to the eighth embodiment may include the inter-string unit structures SHE2, SHE3, SHE4, SHE5 according to any one of the second embodiment to the fifth embodiment instead of the inter-string unit structure SHE according to the first embodiment. The semiconductor memory devices according to the sixth embodiment to the eighth embodiment may be configured to be able to perform an operation similar to that of any one of the second embodiment to the fifth embodiment.

For example, in the semiconductor memory devices according to the first embodiment to the eighth embodiment, at least one of the drain-side select transistor STDT or the source-side select transistor STSB can be omitted. In this case, at least one of the drain-side select transistor STD or the source-side select transistor STS may achieve at least one of the function of the drain-side select transistor STDT or the function of the source-side select transistor STSB.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a plurality of first conductive layers arranged in a first direction intersecting with a surface of the substrate;
a second conductive layer disposed at a position overlapping with the plurality of first conductive layers viewed from the first direction;
a third conductive layer disposed at a position overlapping with the plurality of first conductive layers viewed from the first direction, the third conductive layer being arranged with the second conductive layer in a second direction intersecting with the first direction;
a plurality of first semiconductor column rows arranged in the second direction;
a plurality of first electric charge accumulating layers disposed between each of a plurality of first semiconductor columns included in the plurality of first semiconductor column rows and the plurality of first conductive layers;
a plurality of second semiconductor column rows arranged in the second direction;
a plurality of second electric charge accumulating layers disposed between each of a plurality of second semiconductor columns included in the plurality of second semiconductor column rows and the plurality of first conductive layers;
a fourth conductive layer disposed between the second conductive layer and the third conductive layer, the fourth conductive layer extending in a third direction intersecting with the first direction and the second direction;
a first insulating layer disposed between the second conductive layer and the fourth conductive layer; and
a second insulating layer disposed between the third conductive layer and the fourth conductive layer, wherein
the plurality of first semiconductor column rows each include the plurality of first semiconductor columns arranged in the third direction,
the plurality of first semiconductor columns are each opposed to the plurality of first conductive layers and the second conductive layer,
the plurality of second semiconductor column rows each include the plurality of second semiconductor columns arranged in the third direction,
the plurality of second semiconductor columns are each opposed to the plurality of first conductive layers and the third conductive layer, and
assuming that a cross-section extending in the second direction and the third direction and including one of the plurality of first conductive layers is a first cross-section, and
a distance in the second direction between center positions on the first cross-section of two first semiconductor column rows adjacent in the second direction is a first distance,
the fourth conductive layer has a length in the second direction smaller than a length of the second conductive layer in the second direction, a length of the third conductive layer in the second direction, and the first distance.

2. The semiconductor memory device according to claim 1, wherein
each of outer peripheral surfaces of the plurality of first semiconductor columns included in one first semiconductor column row closest to the plurality of second semiconductor column rows among the plurality of first semiconductor column rows include:
a first region opposed to the second conductive layer; and
a second region opposed to the fourth conductive layer without via the second conductive layer, and
each of outer peripheral surfaces of the plurality of second semiconductor columns included in one second semiconductor column row closest to the plurality of first semiconductor column rows among the plurality of second semiconductor column rows include:
a third region opposed to the third conductive layer; and
a fourth region opposed to the fourth conductive layer without via the third conductive layer.

3. The semiconductor memory device according to claim 1, further comprising:
a fifth conductive layer disposed at a position overlapping with the second conductive layer viewed from the first direction; and
a sixth conductive layer disposed at a position overlapping with the third conductive layer viewed from the first direction, the sixth conductive layer being arranged with the fifth conductive layer in the second direction, wherein
the plurality of first semiconductor columns are each opposed to the fifth conductive layer, and
the plurality of second semiconductor columns are each opposed to the sixth conductive layer.

4. The semiconductor memory device according to claim 1, further comprising:
a contact electrode connected to the fourth conductive layer and extending in the first direction.

5. The semiconductor memory device according to claim 1, wherein
the device is configured to be able to perform a read operation and a write operation, and
in at least one of the read operation or the write operation,
a voltage applied to the fourth conductive layer is smaller than a voltage applied to one of the second conductive layer or the third conductive layer.

6. The semiconductor memory device according to claim 1, further comprising:
a first wiring extending in the second direction and electrically connected to one of the plurality of first semiconductor columns, wherein
the device is configured to be able to perform a first operation, and
in the first operation,
a first voltage is applied to the second conductive layer,
a second voltage larger than the first voltage is applied to the third conductive layer, and
an intermediate voltage between the first voltage and the second voltage is applied to the first wiring.

7. The semiconductor memory device according to claim 3, further comprising:
a first wiring extending in the second direction and electrically connected to one of the plurality of first semiconductor columns, wherein
the device is configured to be able to perform a second operation, and
in the second operation,
a third voltage is applied to the second conductive layer and the third conductive layer,
a fourth voltage smaller than the third voltage is applied to the fifth conductive layer and the sixth conductive layer, and
an intermediate voltage between the third voltage and the fourth voltage is applied to the first wiring.

8. A semiconductor memory device comprising:
a substrate;
a plurality of first conductive layers arranged in a first direction intersecting with a surface of the substrate;
a second conductive layer disposed at a position overlapping with the plurality of first conductive layers viewed from the first direction;
a third conductive layer disposed at a position overlapping with the plurality of first conductive layers viewed from the first direction, the third conductive layer being arranged with the second conductive layer in a second direction intersecting with the first direction;
a first semiconductor column extending in the first direction and opposed to the plurality of first conductive layers and the second conductive layer;
a first electric charge accumulating layer disposed between the plurality of first conductive layers and the first semiconductor column;
a second semiconductor column extending in the first direction and opposed to the plurality of first conductive layers and the third conductive layer;
a second electric charge accumulating layer disposed between the plurality of first conductive layers and the second semiconductor column;
a fourth conductive layer disposed between the second conductive layer and the third conductive layer, the fourth conductive layer extending in a third direction intersecting with the first direction and the second direction;
a first insulating layer disposed between the second conductive layer and the fourth conductive layer; and
a second insulating layer disposed between the third conductive layer and the fourth conductive layer, wherein
the fourth conductive layer has a length in the first direction larger than a length of the second conductive layer in the first direction and a length of the third conductive layer in the first direction.

9. The semiconductor memory device according to claim 8, wherein
a part of an outer peripheral surface of the first semiconductor column is opposed to the second conductive layer, and another part of the outer peripheral surface of the first semiconductor column is opposed to the fourth conductive layer without via the second conductive layer, and
a part of an outer peripheral surface of the second semiconductor column is opposed to the third conductive layer, and another part of the outer peripheral surface of the second semiconductor column is opposed to the fourth conductive layer without via the third conductive layer.

10. The semiconductor memory device according to claim 8, further comprising:
a fifth conductive layer disposed at a position overlapping with the second conductive layer viewed from the first direction; and
a sixth conductive layer disposed at a position overlapping with the third conductive layer viewed from the first direction, the sixth conductive layer being arranged with the fifth conductive layer in the second direction, wherein
the first semiconductor column is opposed to the fifth conductive layer, and
the second semiconductor column is opposed to the sixth conductive layer.

11. The semiconductor memory device according to claim 8, further comprising:
a contact electrode connected to the fourth conductive layer and extending in the first direction.

12. The semiconductor memory device according to claim 8, wherein
the device is configured to be able to perform a read operation and a write operation, and
in at least one of the read operation or the write operation,
a voltage applied to the fourth conductive layer is smaller than a voltage applied to one of the second conductive layer or the third conductive layer.

13. The semiconductor memory device according to claim 8, further comprising:
a first wiring extending in the second direction and electrically connected to the first semiconductor column, wherein
the device is configured to be able to perform a first operation, and
in the first operation,
a first voltage is applied to the second conductive layer,
a second voltage larger than the first voltage is applied to the third conductive layer, and
an intermediate voltage between the first voltage and the second voltage is applied to the first wiring.

14. The semiconductor memory device according to claim 10, further comprising:

a first wiring extending in the second direction and electrically connected to the first semiconductor column, wherein the device is configured to be able to perform a second operation, and in the second operation,
- a third voltage is applied to the second conductive layer and the third conductive layer,
- a fourth voltage smaller than the third voltage is applied to the fifth conductive layer and the sixth conductive layer, and
- an intermediate voltage between the third voltage and the fourth voltage is applied to the first wiring.

15. A semiconductor memory device comprising:
a substrate;
a plurality of first conductive layers arranged in a first direction intersecting with a surface of the substrate;
a second conductive layer disposed at a position overlapping with the plurality of first conductive layers viewed from the first direction;
a third conductive layer disposed at a position overlapping with the plurality of first conductive layers viewed from the first direction, the third conductive layer being arranged with the second conductive layer in a second direction intersecting with the first direction;
a first semiconductor column extending in the first direction and opposed to the plurality of first conductive layers and the second conductive layer;
a first gate insulating film disposed between the plurality of first conductive layers and the first semiconductor column, the first gate insulating film being separated from the third conductive layer in the second direction and including a first electric charge accumulating layer;
a second semiconductor column extending in the first direction and opposed to the plurality of first conductive layers and the third conductive layer;
a second gate insulating film disposed between the plurality of first conductive layers and the second semiconductor column, the second gate insulating film being separated from the second conductive layer in the second direction and including a second electric charge accumulating layer;
a third electric charge accumulating layer disposed between the second conductive layer and the third conductive layer;
a first insulating layer disposed between the second conductive layer and the third electric charge accumulating layer; and
a second insulating layer disposed between the third conductive layer and the third electric charge accumulating layer, wherein
a part of an outer peripheral surface of the first semiconductor column is opposed to the second conductive layer, and another part of the outer peripheral surface of the first semiconductor column is opposed to the third electric charge accumulating layer without via the second conductive layer, and
a part of an outer peripheral surface of the second semiconductor column is opposed to the third conductive layer, and another part of the outer peripheral surface of the second semiconductor column is opposed to the third electric charge accumulating layer without via the third conductive layer.

16. The semiconductor memory device according to claim 15, wherein
the third electric charge accumulating layer includes an insulating layer.

17. The semiconductor memory device according to claim 16, wherein
the third electric charge accumulating layer includes:
- a first part extending in the first direction; and
- a second part extending in the first direction and arranged with the first part in the second direction across a third insulating layer.

18. The semiconductor memory device according to claim 15, wherein
assuming that a cross-section extending in the second direction and a third direction intersecting with the first direction and the second direction is a first cross-section, the first cross-section including one of the plurality of first conductive layers,
in the first cross-section,
- an outer peripheral surface of the first semiconductor column is opposed to the one of the plurality of first conductive layers across a whole circumference, and
- an outer peripheral surface of the second semiconductor column is opposed to the one of the plurality of first conductive layers across a whole circumference.

19. The semiconductor memory device according to claim 15, further comprising:
a first wiring extending in the second direction and electrically connected to the first semiconductor column, wherein
the device is configured to be able to perform a first operation, and
in the first operation,
- a first voltage is applied to the second conductive layer,
- a second voltage larger than the first voltage is applied to the third conductive layer, and
- an intermediate voltage between the first voltage and the second voltage is applied to the first wiring.

20. The semiconductor memory device according to claim 15, further comprising:
a first wiring extending in the second direction and electrically connected to the first semiconductor column, wherein
the device is configured to be able to perform a third operation, and
at a first timing in the third operation,
- a first voltage is applied to the second conductive layer,
- a second voltage larger than the first voltage is applied to the third conductive layer, and
- an intermediate voltage between the first voltage and the second voltage is applied to the first wiring, and
at a second timing in the third operation,
- the second voltage is applied to the second conductive layer,
- the first voltage is applied to the third conductive layer, and
- the intermediate voltage is applied to the first wiring.

* * * * *